United States Patent
Bazarsky et al.

(10) Patent No.: US 10,089,177 B2
(45) Date of Patent: Oct. 2, 2018

(54) MULTI-STAGE DECODER

(71) Applicant: SANDISK TECHNOLOGIES LLC, Addison, TX (US)

(72) Inventors: Alexander Bazarsky, Holon (IL); Ran Zamir, Ramat Gan (IL); Eran Sharon, Rishon Lezion (IL); Idan Alrod, Herzliya (IL)

(73) Assignee: SanDisk Technologies LLC, Addison, TX (US)

( * ) Notice: Subject to any disclaimer, the term of this patent is extended or adjusted under 35 U.S.C. 154(b) by 196 days.

(21) Appl. No.: 15/061,246

(22) Filed: Mar. 4, 2016

(65) Prior Publication Data

US 2016/0179620 A1 Jun. 23, 2016

Related U.S. Application Data

(63) Continuation-in-part of application No. 14/319,480, filed on Jun. 30, 2014, now Pat. No. 9,614,547.

(51) Int. Cl.
*H03M 13/00* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC .......... H03M 13/1108; H03M 13/611; H03M 13/111; H03M 13/3707; H03M 13/1191; H03M 13/1515; H03M 13/152; H03M 13/2957; H03M 13/116; H03M 13/118; G06F 11/0727; G06F 11/076;
(Continued)

(56) References Cited

U.S. PATENT DOCUMENTS 8,086,931 B2 12/2011 Litsyn et al.
8,291,279 B2 10/2012 Sharon et al.
(Continued)

OTHER PUBLICATIONS

Notice of Allowance dated Dec. 8, 2016 in U.S. Appl. No. 14/319,480, 5 pages.
(Continued)

*Primary Examiner* — Christine Tu
(74) *Attorney, Agent, or Firm* — Michael Best & Friedrich LLP

(57) ABSTRACT

An apparatus includes a memory die including a group of storage elements and one or more unallocated redundant columns. A number of the unallocated redundant columns is based on a number of one or more bad columns of the memory die. The apparatus further includes a controller coupled to the memory. The controller is configured to receive data and redundancy information associated with the data from the memory. The data includes a first bit, and the redundancy information includes a second bit. The redundancy information is sensed from the one or more unallocated redundant columns and has a size that is based on the number of one or more bad columns. The controller is further configured to determine a value of the first bit based on one or more parity check conditions associated with the second bit.

23 Claims, 14 Drawing Sheets

(51) Int. Cl.
*G06F 3/06* (2006.01)
*H03M 13/11* (2006.01)
*H03M 13/37* (2006.01)
*G11C 29/00* (2006.01)
*H03M 13/15* (2006.01)
*H03M 13/29* (2006.01)
*G11C 16/34* (2006.01)
*G11C 29/52* (2006.01)
*G11C 29/04* (2006.01)

(52) U.S. Cl.
CPC ........ *G06F 3/0673* (2013.01); *G06F 11/1012* (2013.01); *G11C 29/72* (2013.01); *G11C 29/781* (2013.01); *H03M 13/116* (2013.01); *H03M 13/1108* (2013.01); *H03M 13/118* (2013.01); *H03M 13/1111* (2013.01); *H03M 13/3707* (2013.01); *G11C 16/34* (2013.01); *G11C 29/52* (2013.01); *G11C 2029/0411* (2013.01); *H03M 13/1191* (2013.01); *H03M 13/152* (2013.01); *H03M 13/1515* (2013.01); *H03M 13/2957* (2013.01)

(58) Field of Classification Search
CPC .... G06F 11/1012; G06F 3/0619; G06F 3/064; G06F 3/0673; G06F 11/34; G11C 29/72; G11C 29/781; G11C 29/52; G11C 2029/0411; G11C 16/34
USPC .......................................... 714/758, 763, 766
See application file for complete search history.

(56) References Cited

U.S. PATENT DOCUMENTS

| | | |
|---|---|---|
| 8,429,468 B2 | 4/2013 | D'Abreu et al. |
| 8,464,123 B2 | 6/2013 | Alrod et al. |
| 8,543,891 B2* | 9/2013 | Anholt ............... H03M 13/1111 714/699 |
| 8,621,318 B1* | 12/2013 | Micheloni ........... G06F 11/1012 714/755 |
| 8,635,515 B1 | 1/2014 | Yeo et al. |
| 8,984,376 B1 | 3/2015 | Norrie |
| 9,323,611 B2 | 4/2016 | Chilappagari et al. |
| 2013/0067140 A1 | 3/2013 | Bisen et al. |
| 2013/0073924 A1 | 3/2013 | D'Abreu et al. |
| 2013/0097475 A1 | 4/2013 | Wang et al. |
| 2013/0145231 A1* | 6/2013 | Frayer ................... H03M 13/13 714/763 |
| 2013/0151912 A1 | 6/2013 | Sevugapandian |
| 2013/0227374 A1 | 8/2013 | Desireddi |
| 2013/0238955 A1 | 9/2013 | D'Abreu et al. |
| 2013/0305114 A1* | 11/2013 | Olcay ................ H03M 13/1108 714/755 |
| 2014/0157087 A1 | 6/2014 | Yurzola et al. |
| 2015/0317203 A1* | 11/2015 | Zhou .................. G06F 11/1044 714/773 |

OTHER PUBLICATIONS

Gallager, Robert G., "Low-Density Panty-Check Codes", 1963, 90 pp.
Non-Final Office Action dated May 16, 2016 in U.S. Appl. No. 14/319,480, 11 pages.

* cited by examiner

MULTI-STAGE DECODER

CROSS-REFERENCE TO RELATED APPLICATIONS

The present application is a continuation in part of and claims priority to U.S. patent application Ser. No. 14/319,480, filed Jun. 30, 2014, which is incorporated by reference herein in its entirety.

FIELD OF THE DISCLOSURE

The present disclosure is generally related to decoding data.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

ECC decoding techniques have been developed that provide robust error correction capability. For example, iterative belief-propagation decoding techniques may be used to achieve enhanced correction capability. However, such iterative belief-propagation decoding techniques may have a larger latency and/or may consume more power and processing resources than other, less powerful decoding techniques.

DETAILED DESCRIPTION

Figure 1:
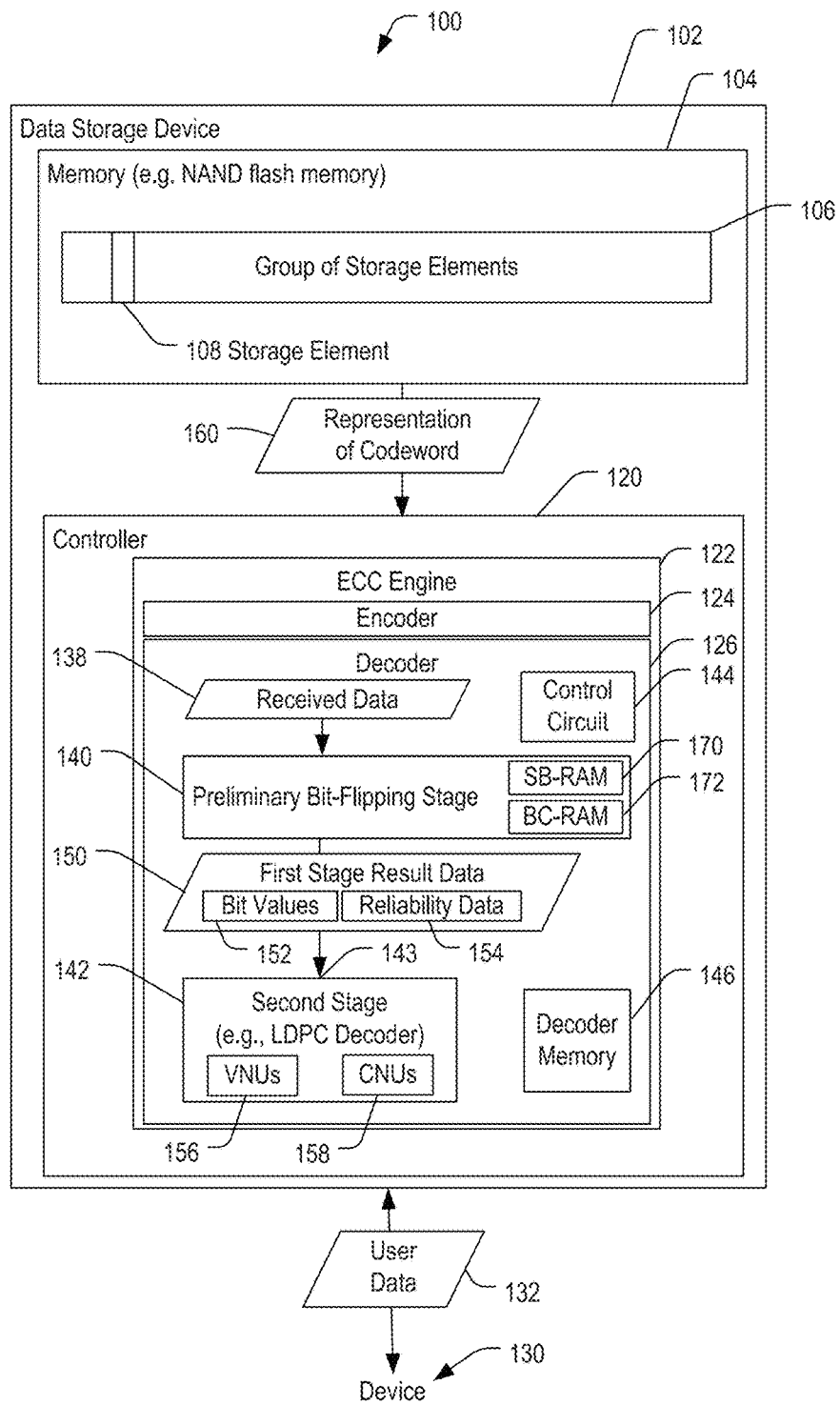
FIG. 1 is a block diagram of a particular illustrative embodiment of a system including a data storage device having a decoder that includes a preliminary bit-flipping stage and a second stage.

A data storage device includes a memory having redundant columns that may replace (or be "swapped" for) one or more unreliable (or "bad") columns of the memory. For example, a defect (e.g., a manufacturing defect) associated with a bit line of the memory may result in an unreliable column of the memory. In this case, a first redundant column may replace the unreliable column, such as by using a circuit (e.g., a fuse or an anti-fuse) to "re-route" write operations and read operations to storage elements of the first redundant column (instead of to storage elements of the unreliable column). The first redundant column may be referred to as an "allocated" redundant column or a "used" redundant column (because the first redundant column is used to replace the unreliable column).

In some cases, a number of the one or more unreliable columns may be less than a number of the redundant columns. For example, the number of redundant columns may be conservative to avoid a circumstance in which a memory die is discarded due to the number of unreliable columns exceeding the number of redundant columns. Thus, in some cases, the data storage device may include at least a second redundant column that is not used to replace an unreliable column of the memory. The second redundant column may be referred to as an "unallocated" or "unused" redundant column (because the second redundant column is not used to replace an unreliable column of the memory).

The data storage device may store data (e.g., a codeword) at a group of storage elements of the memory and may store particular bits of the data at storage elements of allocated redundant columns of the memory (e.g., to replace storage elements of the group that are included in bad columns of the memory). The data storage device may store redundancy information associated with the data at storage elements of unallocated redundant columns of the memory. For example, the data storage device may perform an exclusive-or (XOR) operation based on a subset of bits (e.g., a first bit and one or more other bits) of the data to generate a second bit included in the redundancy data.

The redundancy information may be used at a flipping circuit of a decoder during decoding of the data. For example, the bit-flipping circuit may modify a value of the first bit based on one or more parity check conditions associated with the second bit. In an illustrative example, the bit-flipping circuit may modify the value of the first bit in response to determining that the modified value satisfies the XOR operation. The bit-flipping circuit may generate modified data that includes the modified first bit and may provide the modified data to a second stage of the decoder, such as a low-density parity check (LDPC) decoder. In an illustrative implementation, the second stage may decode the modified data independently of the second bit (e.g., the second stage may detect convergence of the decoding without using the second bit).

Use of the redundancy information by the bit-flipping circuit may enhance error correction performance without increasing power consumption or a number of clock cycles used by the second stage. To illustrate, certain devices may use unallocated redundant columns to store redundancy information that is used during decoding of data. In this scheme, error correction performance may be improved while also increasing power consumption and decoding time. To avoid increasing power consumption and decoding time, other devices may not use unallocated redundant columns, which may decrease data storage efficiency. By storing redundancy information at unallocated redundant columns and by using the redundancy information at a bit-flipping circuit, a data storage device may increase data storage efficiency and error correction performance (e.g., error correction speed, error correction capability, or both) without increasing power consumption or a number of clock cycles used by a second stage (e.g., a high-power or "full-power" decoding stage).

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Referring to FIG. 1, a particular embodiment of a system 100 includes a data storage device 102 coupled to a device 130 (e.g., a host device or an access device). The data storage device 102 includes a decoder 126 configured to receive data read from a memory 104 and to process the data at a preliminary bit-flipping stage 140 prior to initiating decoding at a second stage 142 that may be configured to use soft information and/or belief-propagation decoding techniques. The decoder 126 may provide the error correction capability of decoding using soft information and/or iterative belief-propagation decoding techniques with reduced latency and power consumption as compared to conventional soft information decoders and/or iterative belief-propagation decoders.

The device 130 may be configured to provide data, such as the user data 132, to be stored at the memory 104 or to request data to be read from the memory 104. For example, the device 130 may include a mobile telephone, a music player, a video player, a gaming console, an electronic book reader, a personal digital assistant (PDA), a computer, such as a laptop computer or notebook computer, any other electronic device, or any combination thereof. The device 130 communicates via a memory interface that enables reading from the memory 104 and writing to the memory 104. For example, the device 130 may operate in compliance with a Joint Electron Devices Engineering Council (JEDEC) industry specification, such as a Universal Flash Storage (UFS) Host Controller Interface specification. As other examples, the device 130 may operate in compliance with one or more other specifications, such as a Secure Digital (SD) Host Controller specification as an illustrative example. The device 130 may communicate with the memory 104 in accordance with any other suitable communication protocol.

The data storage device 102 includes the memory 104 coupled to a controller 120. The memory 104 may be a non-volatile memory, such as a NAND flash memory, and the memory 104 may have a planar configuration or a three-dimensional (3D) configuration, as illustrative, non-limiting examples. To illustrate, the memory 104 may include a non-volatile memory having a three-dimensional (3D) configuration that is monolithically formed in one or more physical levels of arrays of memory cells having an active area above a silicon substrate. The memory 104 may also include circuitry associated with operation of the memory cells, such as read/write circuitry. The memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the device 130 while the data storage device 102 is operatively coupled to the device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes an ECC engine 122 that is configured to receive data to be stored to the memory 104 and to generate a codeword. For example, the ECC engine 122 may include an encoder 124 configured to encode data using an ECC encoding scheme or "ECC code", such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 also includes the decoder 126. The decoder 126 is configured to decode data read from the memory 104 to detect and correct, up to an error correction capability of the ECC code, any bit errors that may be present in the data.

The decoder 126 includes the bit-flipping stage 140 and the second stage 142. The decoder 126 may be configured to process received data 138 using the bit-flipping stage 140 as a preliminary decoding stage that precedes the second stage 142. The bit-flipping stage 140 may perform one or more iterations of a bit-flipping process, as described in further detail with respect to FIG. 2.

The decoder 126 may include control circuitry 144, such as dedicated circuitry, one or more state machines, or a hardware processor, as illustrative examples. The control circuitry 144 may be configured to schedule and initiate decoding operations at the bit-flipping stage 140 and at the second stage 142. However, in other implementations, the decoder 126 may not include the control circuitry 144 and one or more operations associated with the control circuitry 144 may instead be implemented by the bit-flipping stage 140, by the second stage 142, by a processor of the controller 120, or a combination thereof. The decoder 126 may also include a decoder memory 146 to store received data and information corresponding to decoding the received data, such as variable node values, check node values, bit positions and counts of bit flips for each bit position, threshold values (e.g., for comparisons to metrics during bit-flipping operations), log likelihood ratios (LLRs), other information corresponding to ECC decoding, or a combination thereof. The decoder memory 146 may be used by the bit-flipping stage 140 and/or by the second stage 142. The decoder memory 146 may be dedicated memory of the decoder 126 or may be included in memory of the controller 120, such as controller random access memory (RAM).

The bit-flipping stage 140 may be a first stage configured to perform one or more iterations of a bit-flipping process on received data prior to attempting to decode the data at the second stage 142. The bit-flipping stage 140 may be configured to process data based on parity checks of the ECC code corresponding to the data. For example, the bit-flipping stage 140 may determine, for each bit of the data, how many parity checks that include the bit are unsatisfied (i.e., parity checks that have a "fail" result indicating incorrect parity among the bits participating in the parity check and signaling that at least one of the participating bits has an incorrect value). As described in further detail with respect to FIG. 2, the bit-flipping stage 140 may be configured to serially scan bit values of the received data to determine, for each bit position, whether to change a corresponding bit value (e.g., "flip" the bit at the bit position).

The bit-flipping stage 140 may include a soft-bits random access memory (SB-RAM) 170 and a "bad" column RAM (BC-RAM) 172. The SB-RAM 170 may be configured to store soft bit information generated when the received data 138 is read from the memory 104. For example the SB-RAM 170 may store a value for each bit of received data 138 indicating a reliability of the data or an indication of how close or distant a storage element is to an inter-state boundary. For example, in an implementation where the memory 104 is a flash memory, the soft bit information may be generated by reading flash cell threshold values at a higher resolution than is required to determine a state of the cells. The soft bit information may indicate a proximity of a memory cell's threshold voltage to a boundary voltage between cell states. The BC-RAM 172 may store indices of bad column locations and/or bad bit-line locations of the memory 104 (e.g., indicating columns or bit-lines of the memory 104 that are detected as being associated with unreliable data, such as due to physical defects or error-inducing causes such as over-programming). Information stored in the BC-RAM 172 may be used to indicate reduced reliability of one or more bits of the received data 138.

The bit-flipping stage 140 may be configured to generate first stage result data 150. For example, the first stage result data 150 may include first stage bit values 152 that result after one or more iterations of the bit-flipping process that is applied at the bit-flipping stage 140. In addition, or alternatively, the first stage result data 150 may include first stage reliability data 154 that indicates a reliability corresponding to one or more of the values of the received data 138 that is input to the bit-flipping stage 140 or corresponding to one or more of the first stage bit values 152. To illustrate, the first stage reliability data 154 may include or be based on soft bit information from the SB-RAM 170 and/or may include one or more reliability values determined at least partially according to index value(s) in the BC-RAM 172 (e.g., corresponding to an unreliable column of storage elements). The first stage result data 150 may be provided to an input 143 of the second stage 142.

The second stage 142 may include a low-density parity check (LDPC) decoder that is configured to use soft information (a "soft LDPC decoder"). For example, the second stage 142 may be configured to perform an iterative belief-propagation decoding process on data received at the input 143 of the second stage 142. However, in other implementations, the second stage 142 may not be configured to perform belief-propagation decoding. The data received at the input 143 may include bit values (e.g., "hard" bits indicating a '0' or '1' value per bit position), reliability information (e.g., "soft" bits indicating a reliability or likelihood that a corresponding hard bit value is correct), or a combination thereof. For example, the data may be mapped to variable nodes that represent columns of a parity check matrix associated with an ECC code. A set of check nodes may represent rows of the parity check matrix. An "edge," such as represented in the Tanner graphs illustrated in FIG. 2 as a line connecting a variable node and a check node, indicates a non-zero entry in the parity check matrix at the intersection of the column corresponding to the variable node and the row corresponding to the check node.

The second stage 142 may include circuitry corresponding to multiple variable node units (VNUs) 156 and may be configured to update values of the variable nodes (e.g., data structures in the decoder 126) based on messages from multiple check node units (CNUs) 158. The CNUs 158 may be configured to receive messages (e.g., LLR values) from the VNUs 156 and to generate messages to be sent to the variable nodes. For example, each CNU may be configured to generate, for each variable node participating in the parity check corresponding to the CNU, an LLR value indicating a reliability corresponding to one or more other variable nodes participating in the parity check. Each set of message passing, from variable node to check node and from check node to variable node, may correspond to a decoding iteration of the second stage 142.

The decoder 126 may be configured to process received data at the bit-flipping stage 140 without first attempting to decode the received data at the second stage 142. For example, the decoder 126 may receive a representation 160 of a codeword read from the memory 104 and provide the representation 160 to an input of the bit-flipping stage 140 as received data 138. In some implementations, the received data 138 may vary from the representation 160, such as due to de-scrambling or other processing prior to decoding at the decoder 126.

After performing one or more iterations or partial iterations of a bit-flipping process at the bit-flipping stage 140, the decoder 126 may provide the first stage result data 150 to the input 143 of the second stage 142. By performing preliminary processing at the bit-flipping stage 140, a number of errors may be reduced and/or reliability data may be generated to improve an accuracy of a starting condition for the second stage 142. The bit-flipping stage 140 may operate using a reduced latency and with lower complexity as compared to the second stage 142, and a latency and power consumption introduced by operating the bit-flipping stage 140 may be offset by a reduced number of decoding iterations at the second stage 142 that results from the improved starting condition provided by the bit-flipping stage 140.

During operation, the user data 132 may be received from the device 130, encoded by the encoder 124 to generate an ECC codeword, and the ECC codeword may be stored in the group 106 of storage elements in the memory 104. In response to receiving a request from the device 130 to read data, the controller 120 may read the representation 160 of the ECC codeword from the memory 104. The representation 160 may match the ECC codeword or may differ from the ECC codeword due to one or more bit errors (e.g., a bit error that occurred during storage at the memory 104). The controller 120 may provide the representation 160 to be stored in the decoder memory 146 as the received data 138.

The decoder 126 may process the received data 138 using the bit-flipping stage 140 prior to attempting to decode the received data 138 at the second stage 142. The bit-flipping stage 140 may perform one or more iterations of a bit-flipping process, as described in further detail with respect to FIG. 2. If the bit-flipping stage 140 succeeds in decoding the received data 138 (i.e., the received data 138 is a valid ECC codeword or is converted to a valid ECC codeword after one or more iterations of the bit-flipping process), decoding may end without operation of the second stage 142.

If one or more errors remain at the conclusion of the bit-flipping stage 140, the first stage result data 150 may be provided to the input of the second stage 142 (e.g., by updating values in the decoder memory 146 based on the bit-flipping results and scheduling belief-propagation operations to be performed by the second stage 142 on the updated values). Decoding is initiated at the second stage 142 at least partially based on the first stage result data 150. For example, in some implementations, the first stage bit values 152 may be provided as input values to the second stage 142 and may have a fewer number of errors as compared to the received data 138. In other implementations, the received data 138 may be provided as input values to the second stage 142, and the first stage reliability data 154 may be used to indicate a reliability of bit values of the received data 138 (e.g., based on how many times a bit's value was flipped during processing in the bit-flipping stage 140).

If the second stage 142 converges on a valid ECC codeword, a data portion of the codeword may be provided to the device 130. Otherwise, such as when the second stage 142 does not converge within a predetermined number of iterations, the decoder 126 may signal to the controller 120 that the received data 138 is uncorrectable.

By performing preliminary processing using the bit-flipping stage 140 and using results of the bit-flipping stage 140 to initialize the second stage 142, overall latency and power consumption may be reduced in the decoder 126 even when the bit-flipping stage 140 fails to find a valid ECC codeword. As a result, power consumption and read latency may be improved in the data storage device 102.

Although the decoder 126 is described as processing one or more decoding iterations at the bit-flipping stage 140 and using the first stage result data 150 as input to the second stage 142, the decoder 126 may be implemented to decode data according to one or more other decoding schemes. For example, one embodiment may perform decode processing at the second stage 142 (e.g., at a LDPC decoder) for a number of iterations, and once the syndrome is low enough (e.g., a number of errors in the data is lower than a bit-flipping correction threshold), the decoder 126 may transfer decode processing to the bit-flipping stage 140. In this embodiment, in contrast to embodiments where the bit-flipping stage 140 is not intended to decode the received data 138 and instead is intended to perform lower-power, preliminary processing of the received data 138, the bit-flipping stage 140 may be intended to complete decoding of the partially-decoded data received from the second stage 142 with a lower power consumption as compared to completing decoding at the second stage 142.

In another embodiment, decode processing may alternate between one or more iterations at the bit-flipping stage 140 and one or more iterations at the second stage 142. For example, after performing a first number of iterations (e.g., 1, 2, 3, or any other number of iterations) at the bit-flipping stage 140, the decoder 126 may transfer processing to the second stage 142 to perform a second number of iterations (e.g., 1, 2, 3, or any other number of iterations) at the second stage 142, after which the decoder 126 may transfer processing back to the bit-flipping stage 140 to perform the first number of iterations. The decoder 126 may toggle processing between the bit-flipping stage 140 and the second stage 142 to converge to a valid codeword while saving on total power as compared to decoding the data exclusively at the second stage 142.

As an example, in an embodiment where the bit-flipping stage 140 consumes less power than the second stage 142 but has a lower correction capability than the second stage 142, decode processing of the received data 138 may begin at the bit-flipping stage 140 even though a number of errors in the received data 138 may exceed the correction capability of the bit-flipping stage 140 (but not exceed the correction capability of the second stage 142). The bit-flipping stage 140 may correct some errors (e.g., isolated errors in the data having low reliability values) at reduced power as compared to the second stage 142, and then decoding may be transferred to the second stage 142. After a number of iterations at the second stage 142 correcting errors in the data, a number of remaining errors in the data may be within the correcting capability of the bit-flipping stage 140 (e.g., as indicated by a low syndrome weight), and decoding may be transferred back to the bit-flipping stage 140 for correction of the remaining errors at reduced power as compared to correction of the remaining errors at the second stage 142. As a result, the received data 138 may be decoded using less overall power as compared to decoding the received data 138 exclusively with the second stage 142.

Figure 2:
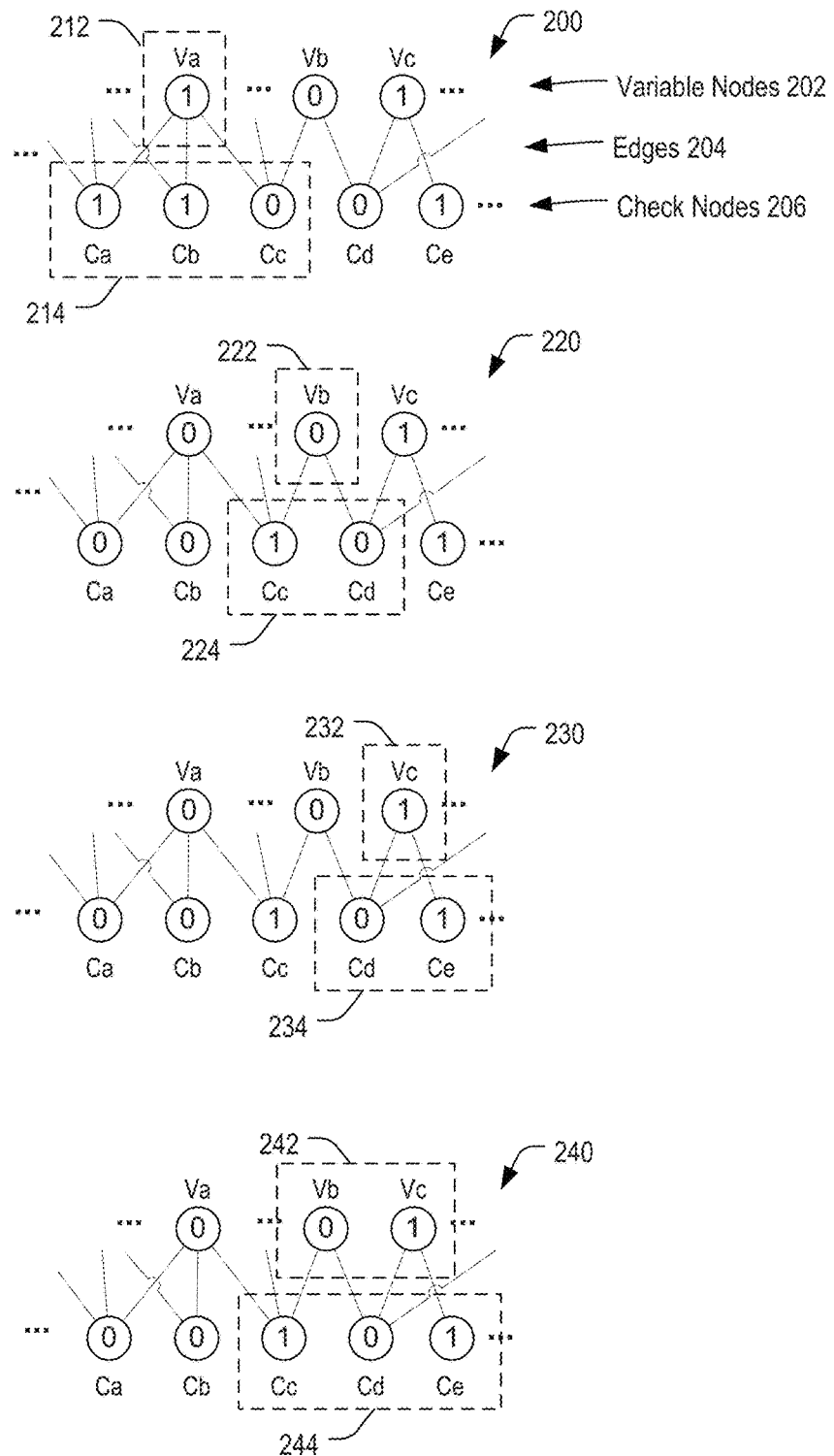
FIG. 2 is a diagram illustrating a particular embodiment of operation of the bit-flipping stage of the decoder of FIG. 1.

FIG. 2 illustrates a particular embodiment of a bit-flipping process that may be performed by the bit-flipping stage 140 of FIG. 1. A first graph 200 (e.g., a Tanner graph) illustrates variable nodes 202 including representative variable nodes Va, Vb, and Vc, check nodes 206 including representative check nodes Ca, Cb, Cc, Cd, and Ce, and edges 204 illustrating connections between the variable nodes 202 and the check nodes 206. Each variable node 202 corresponds to a bit position of data to be decoded and is illustrated as including a bit value (e.g., a '0' value or a '1' value). The variable nodes may include reliability data (e.g., LLRs). The check nodes 206 represent parity check equations (e.g., a check node connected to multiple variable nodes may have a value indicating a result of an exclusive-OR (XOR) of the bit values of the connected variable nodes). The edges 204 indicate which variable nodes 202 participate in which parity check equations. Although illustrated as having three variable nodes 202 and five check nodes 206 for clarity of explanation, any number of variable nodes and check nodes may be included.

In the first graph 200, Va is a currently scanned node 212 of a serial scanning operation. Va participates in parity check equations corresponding to check nodes Ca, Cb, and Cc, illustrated as a group 214 of check nodes responsive to the variable node Va. As illustrated, Ca and Cb have '1' values, corresponding to unsatisfied parity check equations, and Cc has a '0' value, corresponding to a satisfied parity check equation. For example, the parity check equation for each check node 206 may be satisfied when the exclusive-OR (XOR) of the bit values of all variable nodes participating in the parity check equation is '0' and may be unsatisfied when the XOR is '1'. The value of each of the check nodes 206 may be referred to as a "syndrome bit."

A determination is made whether to change the value of the currently scanned node 212 (Va) based on a corresponding threshold number and a metric that corresponds to unsatisfied check nodes of the group 214. For example, the metric may correspond to a count of unsatisfied check nodes in the group 214 (i.e., 2) and the threshold may correspond to one-half of the number of check nodes in the group 214 (i.e., ½ of 3=1.5). Because the metric (2) exceeds the threshold (1.5) for Va, the bit value of the variable node Va is changed from '1' to '0', and the values of each of the check nodes in the group 214 is also changed, as illustrated in a second graph 220.

The second graph 220 illustrates another portion of the serially scanning operation where Vb is a currently scanned node 222. A group 224 of check nodes responsive to Vb includes Cc and Cd. A determination is made whether to change the value of Vb based on a corresponding threshold number and a metric that corresponds to unsatisfied check nodes of the group 224. For example, when the metric corresponds to a count of unsatisfied check nodes in the group 224 (i.e., 1) and the threshold corresponds to one-half of the number of check nodes in the group 224 (i.e., 1), the value of the variable node Vb may be unchanged because the metric does not exceed the threshold.

A third graph 230 illustrates another portion of the serially scanning operation where Vc is a currently scanned node 232. A group 234 of check nodes responsive to Vc includes Cd and Ce. A determination is made whether to change the value of Vc based on a corresponding threshold number and a metric that corresponds to unsatisfied check nodes of the group 234. For example, when the metric corresponds to a count of unsatisfied check nodes in the group 234 (i.e., 1) and the threshold corresponds to one-half of the number of check nodes in the group 234 (i.e., 1), the value of the variable node Vc may be unchanged because the metric does not exceed the threshold.

The serial scanning operation may continue and may include scanning of all variable nodes to complete a first iteration. Serial scanning may be repeated until a threshold number of iterations have been completed. For example, the threshold number may be 1, 2, 3, or any other number of iterations. Serial scanning may be terminated in response to determining that all check nodes 206 are satisfied, indicating that the values in the variable nodes 202 represent a valid codeword. However, the serial scanning operation performed during the bit-flipping stage 140 may not be intended to achieve full decoding of the codeword but may instead be intended to reduce the number of errors in the data. To illustrate, for a large percentage of data words read from the memory 104, full decoding at the second stage 142 may be performed after completion of the bit-flipping processing at the bit-flipping stage 140.

Alternatively, or in addition, the serial scanning operation may be intended to compute initial reliabilities for decoding at the second stage 142. For example, bits that flip values during the bit-flipping stage 140 may be assigned lower reliabilities than bits that do not flip during the bit-flipping stage 140.

A fourth graph 240 illustrates another implementation that represents a generalization of the bit-flipping process to sets of multiple variable nodes. A currently scanned group of nodes 242 includes the nodes Vb and Vc, and a group 244 of check nodes includes all check nodes that are responsive to any one or more variable nodes in the group of nodes 242. The variable nodes in the currently scanned group of nodes 242 may be flipped as a group based on a net effect on the check nodes of the group 244.

To illustrate, when the check nodes Cc, Cd, and Ce in the group 244 are equally weighted (or unweighted), flipping variable node Vb independent of Vc would change values of (Cc, Cd) from (1, 0) to (0, 1) but would not reduce the number of unsatisfied parity checks. As a result, Vb may remain unchanged. Similarly, flipping variable node Vc independent of Vb would change values of (Cd, Ce) from (0, 1) to (1, 0) but would not reduce the number of unsatisfied parity checks. As a result, Vc may also remain unchanged.

However, if Vb and Vc are considered together, Vb and Vc may both be flipped to satisfy Cc, Cd, and Ce (i.e., to cause all check nodes in the group 244 to have a '0' value). Determining whether to flip pairs of variable node values may be determined based on the probabilities:

Pr ($bit_i$, $bit_j$/m unsatisfied, n unsatisfied), where m is the number of unsatisfied parity check equations that $bit_i$ participates in and n is the number of unsatisfied parity check equations that $bit_j$ participates in, and the probabilities may be computed for all combinations of whether $bit_i$ and/or $bit_j$ has a correct value or an erroneous value and for all the valid combinations of m and n.

An alternative method of determining whether to flip pairs of variable node values may be based on the characteristic that when values of both variable nodes are flipped, any check node that is responsive to both of the variable nodes remains unchanged (e.g., check node Cd does not change values when Vb and Vc are simultaneously flipped). Thus, check nodes that are responsive to both variable nodes may be ignored when determining whether to flip a pair of variable nodes. For example, the metric that is calculated for one of the variable nodes in the group may exclude at least one check node that is responsive to the variable node and that is further responsive to a second variable node in the group. To illustrate, a determination of whether to flip Vb and Vc may be made based on the values of Cc and Ce, representing the check nodes in the group 244 that change values responsive to flipping Vb and Vc together. For example, a determination of whether to flip variable node Vb may be made based on check node Cc (e.g., a metric may be calculated for Vb based on Cc and excluding Cd), followed by a determination of whether to flip variable node Vc based on check node Ce (e.g., a second metric may be calculated for Vc based on Ce and excluding Ce). In response to a determination that Vb is to be flipped and a determination that Vc is to be flipped, both Vb and Vc may be flipped together.

In some implementations, testing for all pairs of variable nodes may be performed. In other implementations, testing for all pairs of adjacent variable nodes may be performed. Testing for pairs of variable nodes may be limited to pairs of variable nodes that were not determined to be flipped during bit-flipping processing of the variable nodes individually. Although the fourth graph 240 illustrates generating a bit-flipping decision using a two-variable-node group of nodes 242, in other implementations the group of nodes 242 may include more than two variable nodes that are processed together.

Various modifications to the serial scanning operation described in the graphs 200, 220, and 230 may be implemented. For example, the threshold may correspond to one-half of the number of parity check equations that are participated in by the variable node. In other implementations, the threshold corresponding to each variable node may be dynamically determined according to an empiric method. To illustrate, the probabilities Pr {bit in error/i unsatisfied checks} where $i \in \{0 \ldots d_v\}$ correspond to the probabilities that a variable node bit is erroneous given that the variable node participates in "i" unsatisfied parity check equations, where $d_v$ is the degree of the variable node (i.e., how many parity check equations the variable node participates in) and where i has a value selected from the set of integers from 0 to $d_v$. These probabilities may be computed according to simulations at a given signal-to-noise ratio (SNR) for every variable node and for each iteration of the serial scanning operation. The threshold for the variable node may be chosen to be the lowest i value where the probability is at least a selected amount (e.g., 0.5). The probabilities may be computed off-line and used to select the thresholds as a function of a SNR during data read from the memory 104.

Another example of an empiric method of dynamically determining the threshold corresponding to each variable node includes computing the threshold according to Equation (1):

$$Q_v = P_v + \sum_c R_{cv} = P_v + (d_v - |S|) \cdot |R| - |S| \cdot |R| = P_v + (d_v - 2 \cdot |S|) \cdot |R| < 0$$

where:

$$P_v = \log_2\left(\frac{1 - BER}{BER}\right),$$

'BER' can be BER from the channel or the current BER during decoding $$|R| = \log_2\left(\frac{1 - q}{q}\right),$$

$$q = \frac{1 - (1 - 2 \cdot BER)^{d_c}}{2},$$

'BER' here is the current BER during decoding

In this example, $P_v$ corresponds to a LLR of the variable node 'v', $R_{cv}$ is a update message from check node 'c' to the variable node 'v', |S| is a number of unsatisfied checks that 'v' participates in, and BER is a bit error rate. The smallest value of |S| that satisfies the inequality $P_v + (d_v - 2 \cdot |S|) \cdot |R| < 0$ may be chosen as the threshold.

As another example, a density evolution method of dynamic threshold determination may be performed using assumptions that the data is received via a memory-less channel and that the code graph has no cycles. The probability for each bit to be in error may be tracked and an 'average' threshold may be chosen to reduce or minimize a number of bit errors.

As another example, an on-line method of dynamic threshold determination may determine an appropriate threshold according to estimation of the BER during decoding. The estimation of the BER may be determined based on the syndrome weight (the number of unsatisfied parity checks of the entire codeword). Given the estimation of the BER, the threshold may be computed according to Equation (1).

In some implementations, different threshold sets based on different values of SNR may be precomputed. A BER value may be estimated, such as according to an initial syndrome weight that is available at an early stage of decoding. The estimated BER value may be used to select a set of thresholds. In other cases, the threshold sets may be a function of the read state, the logical page containing the read data, or a combination of the read state and the logical page. For example, if a certain bit in a read state is close to a transition point, then its reliability is low and the threshold for flipping such a bit may be set to a predetermined threshold. Another bit which is further from the transition point may be associated with a different predetermined threshold.

Figure 3:
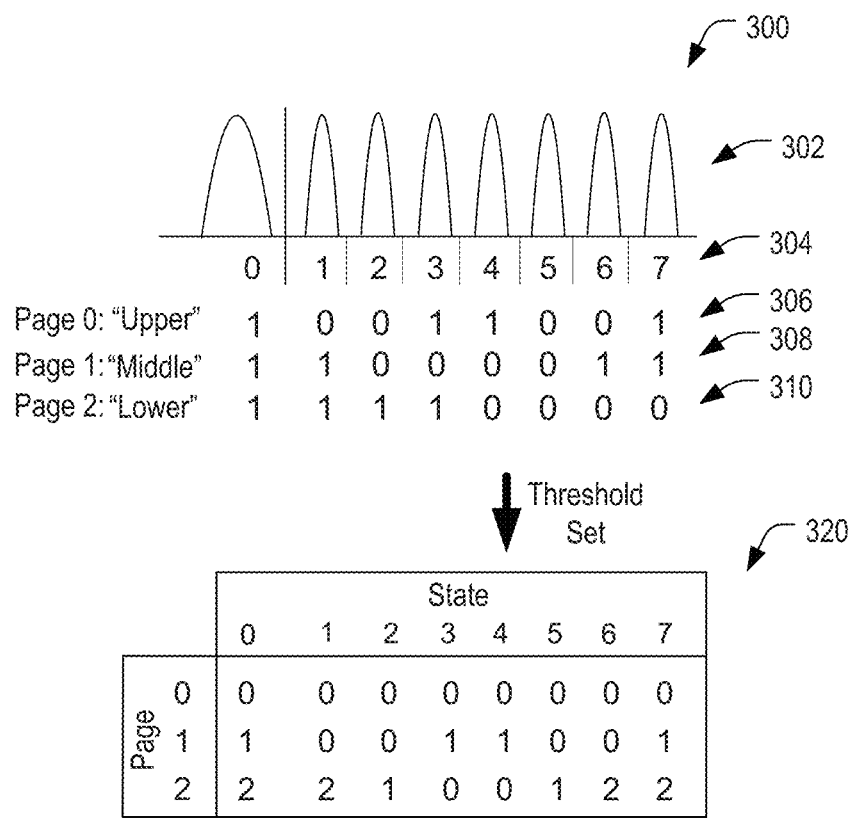
FIG. 3 is a diagram illustrating a mapping of bits to states and a table of threshold sets that may be used at the decoder of FIG. 1.

FIG. 3 depicts an example of a mapping 300 of bit values to storage element states and a table 320 that identifies a particular threshold set for each page/state combination of the storage elements. The mapping 300 graphically depicts a distribution 302 of storage element states (e.g., flash cell threshold voltages) and a state identifier 304 associated with each state in an eight-state-per storage element (or three bits-per-cell (3BPC)) implementation. Each state is associated with a 3-bit value, having one bit corresponding to an "upper" logical page (page 0) 306, one bit corresponding to a "middle" logical page (page 1) 308, and one bit corresponding to a "lower" logical page (page 2) 310. The table 320 includes three different threshold sets (set 0, set 1, and set 2, each set containing one or more thresholds) which may be associated with each page in each state. Optionally, a different threshold set may be associated with each page. The upper page 306 may be associated as a page with the threshold set 0, while for the other pages 308-310 the associated threshold set may be computed as a function of the difference between the states and the transition points in the page. In case a threshold set is defined per state the associated threshold set may be computed as a function of the difference of the various pages in the state from the transition points in their respective page.

For example, the mapping 300 depicts four transition points in the upper page 306: 0-1 (i.e., between state 0 and state 1), 2-3, 4-5, and 6-7. Every state is a distance of one state from a nearest transition point of the upper page 306, and the table 320 assigns threshold set 0 to all states when decoding data in the upper page 306. The mapping 300 depicts two transition points in the middle page 308: 1-2 and 5-6. States 1, 2, 5, and 6 are at a distance of one state from a nearest transition point of the middle page 308, and the table 320 assigns threshold set 0 to these states. States 0, 3, 4, and 7 are at a distance of two states from a nearest transition point of the middle page 308, and the table 320 assigns threshold set 1 to these states. The mapping 300 depicts a single transition point (3-4) in the lower page 310, and the table 320 assigns threshold set 0, 1, or 2 to each state based on its distance from the transition point.

Although FIG. 3 depicts selecting from one of three threshold sets based on a page/state combination, in other implementations threshold sets may be selected based on state and not page (e.g., the table 320 may map each of the eight states 304 to a distinct threshold set of eight predefined threshold sets, independent of page) or based on page and not state (e.g., the table 320 may map each of the three pages 306-310 to a distinct threshold set of three predefined threshold sets, independent of state), as illustrative, non-limiting examples. Other functions may also be considered for computing the threshold sets.

In some implementations, reliability information may be used to determine thresholds. For example, storage elements of "bad" columns of the memory 104 (e.g., indicated by a value stored in the BC-RAM 172 of FIG. 1) may be read as storing a '0' or '1' value independent of the data programmed to the storage elements. Bits with low reliability may be assigned a lower threshold and may be more likely to be flipped. A LLR for such storage elements may be updated to indicate low reliability for determining thresholds. For example, an updated LLR to indicate low reliability for determining thresholds may be provided as the value of $P_V$ of Equation (1). Other types of reliability information may be used to adjust threshold computations. For example, a threshold may be lowered in response to a variable node value changing during a previous iteration of a multi-iteration bit-flipping process, or in response to soft bit information read from the memory 104 indicating lower reliability, as illustrative, non-limiting examples.

Figure 4:
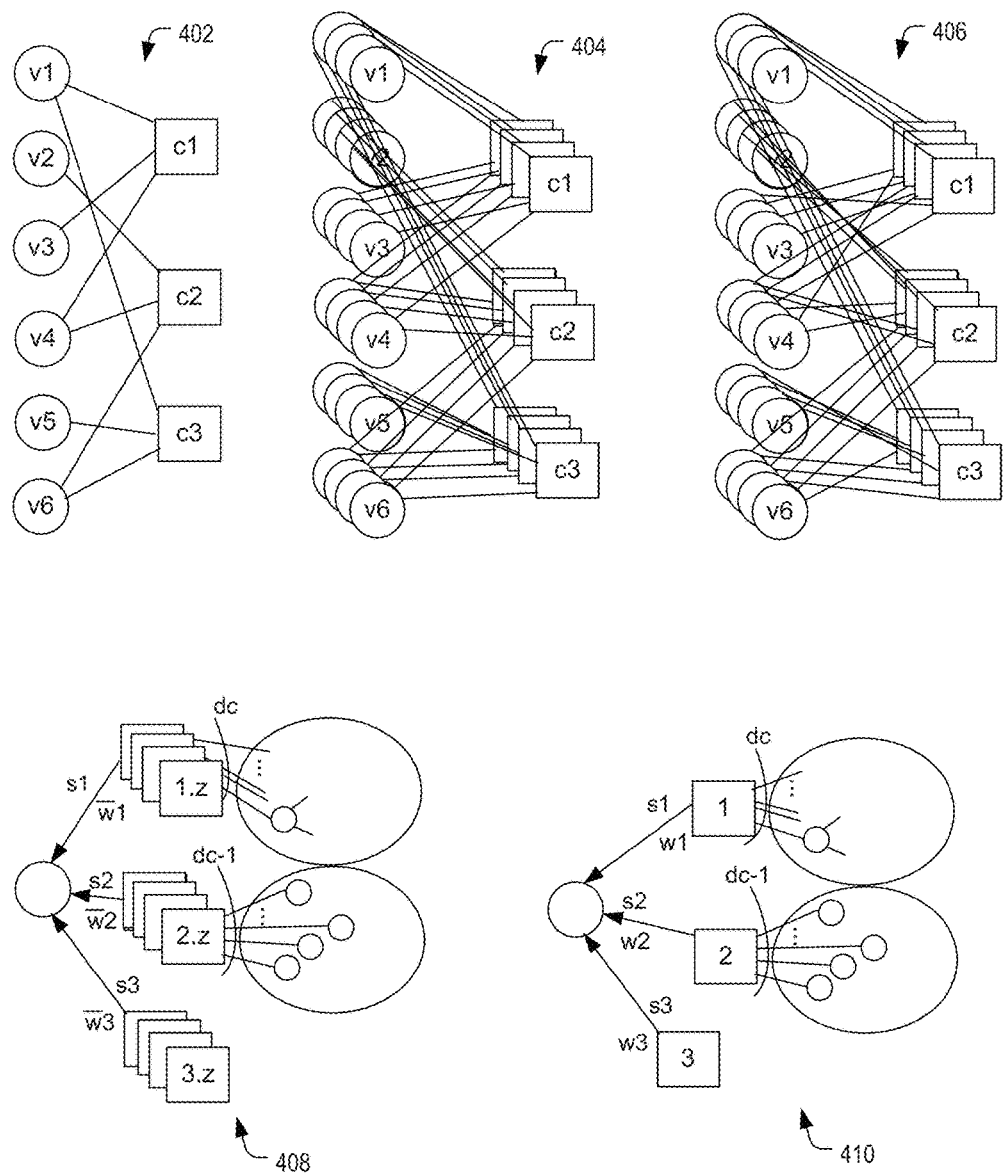
FIG. 4 is a diagram illustrating examples of lifting/quasi-cyclic LDPC structure and node weighting that may be used at the decoder of FIG. 1.

The metric for each variable node may be determined using weights corresponding to check nodes. For example, the graphs 200, 220, 230 of FIG. 2 depict a bit-flipping process that uses no weights (or alternatively, all weights have a '1' value). In this example, the metric corresponds to $$\sum_i s_i$$

where $s_i$ is a check node value for each check node i that the variable node participates in. As another example, 'average' weights may be used, such as generated according to empiric or analytical calculations. In this example, the metric may be determined according to $$\sum_i \overline{w}_i s_i$$

where $\overline{w}_i$ is the average weight that is common for all of the Z lifted check nodes that are lifted from a common check node in an LDPC code implementation based on lifted nodes and having a lifting factor of Z, such as illustrated in FIG. 4.

FIG. 4 illustrates an example of generating an LDPC code based on a lifted graph (quasi-cyclic LDPC (QC-LDPC)) that may be constructed by lifting a relatively small bipartite graph (protograph) 402 by a lifting factor Z such that Z disjoint copies 404 of the protograph 402 are generated. Although the protograph 402 is illustrated as having six variable nodes v1-v6 and three check nodes c1-c3, coupled by edges represented by lines, for ease of explanation, a protograph used to generate a QC-LDPC code implemented by the decoder 126 of FIG. 1 may include more than six variable nodes and three check nodes.

Each lifted edge of the protograph may be permuted (e.g., using a cyclic permutation or any other permutation, such as randomly) to generate from the Z disjoint protographs 404 a single bipartite graph (lifted graph) 406.

A graph 408 illustrates using average weights where the metric is determined according to $$\sum_i \overline{w}_i s_i$$

where $\overline{w}_i$ is the average weight that is common for all of the Z lifted check nodes that are lifted from a common "super" check node in an LDPC code implementation based on lifted nodes and having a lifting factor of Z. As illustrated, the super check node 1 has a value s1, includes Z check nodes 1.1, 1.2, ..., 1.Z, and has degree dc (e.g., receives messages from dc variable nodes). The super check node 2 has a value s2, includes Z check nodes 2.1, 2.2, ..., 2.Z, and has degree dc-1.

In other implementations, such as illustrated in a graph 410, a weight $w_i$ may be separately determined for each check node and the metric may be determined according to $$\sum_i w_i s_i.$$

Each weight $w_i$ may be updated during the decoding procedure. A value of $w_i$ may be lower when at least one variable node that participates in the parity check equation of check node i is not reliable, and a value of $w_i$ may be higher when all variable nodes that participate in the parity check equation are reliable. A variable node may be considered to be reliable or unreliable according to a comparison of the number of unsatisfied checks it participates in as compared to a reliability threshold.

For example, a reliability threshold may be determined and variable nodes that participate in a greater number of satisfied parity checks than the reliability threshold may be considered reliable variable nodes. The reliability threshold can be different for each variable node (for example, the reliability threshold may be based on the degree of a variable node) and may be adjusted from iteration to iteration of the bit-flipping operation. Each check node may include a bit map of $d_c$ entries (where $d_c$ is the number of variable nodes that participate in the parity check equation). Each entry of the bit map may indicate whether the corresponding variable node is considered to be reliable or not (e.g., a '0' value may indicate reliability and a '1' value may indicate unreliability). During the bit-flipping procedure, when checking whether to change a value of a specific variable node, an appropriate weight for each check node may be calculated according to the bit map of the check node. If at least one of the other variable nodes is considered to be not reliable (based on extrinsic information), a lower weight may be determined for the check node. Otherwise, a higher weight is determined for the check node. The bit map of each check node may be updated during the decoding procedure according to the bit flip operations.

Use of individual weights for each check node may provide more accurate bit-flipping decisions as a result of dynamic computation of the weights. However, using "average" weights enables reduced storage space as compared to storing individual weights for each check node. In addition, because average weights may be generated a-priori, weight information may be stored in less expensive read-only memory (ROM) instead of in RAM. Storing check node weight data in ROM instead of RAM may reduce a cost of the decoder 126.

In some implementations, the bit-flipping process may implement a variable node bit-flipping schedule based on the degree of the variable nodes. For example, variable nodes with higher degrees (i.e., that participate in more parity check equations) may be processed before variable nodes with lower degrees. Variable nodes with higher degrees may be considered more reliable due to participating in more parity check equations, and erroneous variable node values may be more easily detected for variable nodes having higher degrees than for variable nodes having lower degrees. By processing higher-degree variable nodes before processing lower-degree variable nodes, "easier" errors may be corrected earlier in the bit-flipping process, reducing a number of remaining errors when lower-degree variable nodes are processed and enabling more accurate bit-flipping decisions for lower-degree variable nodes.

When bit-flipping is determined based on comparing the metric for each variable node (e.g., a count of unsatisfied parity checks) to a corresponding threshold, a possibility exists that all variable nodes retain their values during an iteration of the bit-flipping process, even though errors still exist in the data. In this case, the bit-flipping process may terminate rather than continuing until a pre-set number of iterations have been performed. Alternatively, one or more of the thresholds may be lowered to increase the likelihood that one or more variable nodes may change value during a subsequent iteration of the bit-flipping process.

Figure 5:
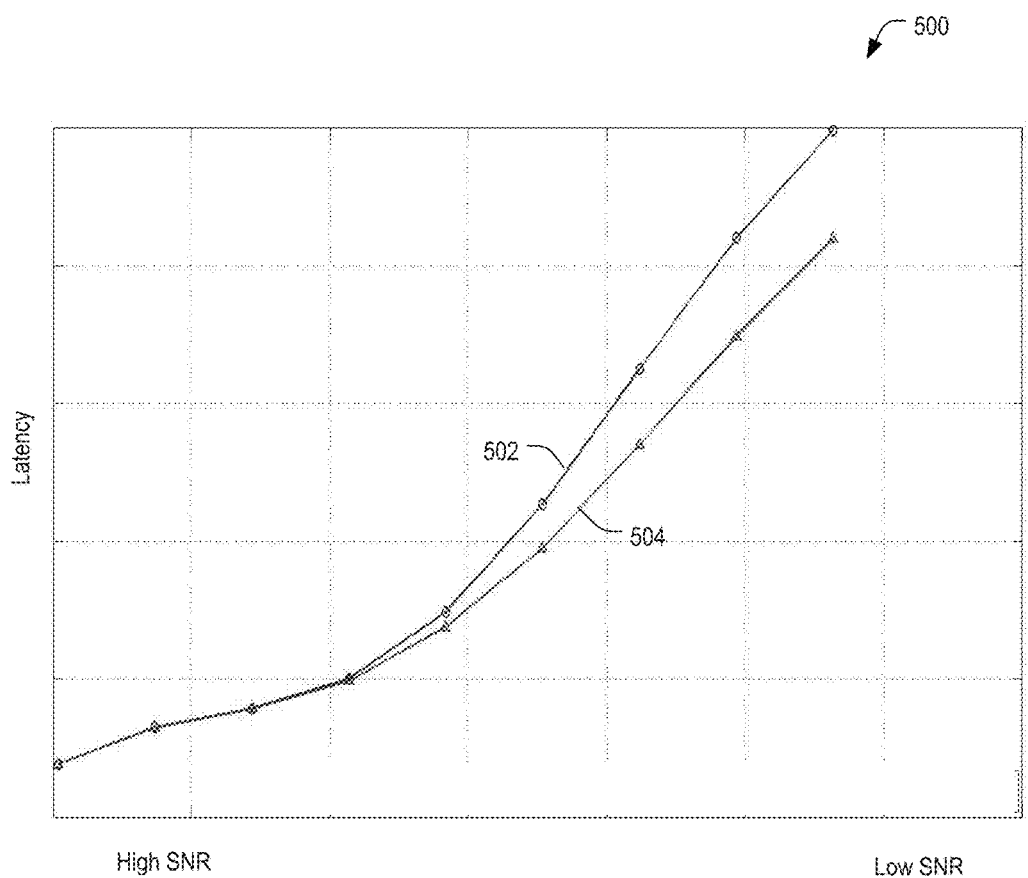
FIG. 5 is a graph illustrating latency associated with the decoder of FIG. 1.

FIG. 5 depicts a graph 500 illustrating decoding latency based on a signal-to-noise ratio (SNR) (or bit error rate (BER)) according a particular embodiment of the decoder 126 of FIG. 1. A first curve 502 corresponds to latency of decoding by processing received data by the bit-flipping stage 140, followed by decoding the received data at the second stage 142 (e.g., a soft LDPC decoder that uses belief propagation) without using results of the bit-flipping stage 140 (i.e., without using the first stage result data 150 to initialize the second stage 142). A second curve 504 corresponds to latency of decoding by processing received data by the bit-flipping stage 140, followed by decoding the received data at the second stage 142 using results of the bit-flipping stage 140 (e.g., using the bit values of the received data 138 and using the first stage reliability data 154 from the bit-flipping stage 140 based on counts of bit-flips for each bit value).

Both curves 502, 504 illustrate relatively low latency at high SNR values, indicating that decoding latency is primarily governed by decoding success in the bit-flipping stage 140 when the received data 138 has relatively few errors. At decreasing SNR/increasing BER, decoding latency increases as the bit-flipping stage 140 is increasingly unlikely to be successful and decoding completes at the second stage 142. At lower SNR, latency for the first curve 502 exceeds latency for the second curve 504. A latency difference between the first curve 502 and the second curve 504 for a particular SNR indicates a performance improvement during belief-propagation decoding due to improved starting conditions provided by the bit-flipping stage 140.

Additional performance benefits may be provided based on efficient initialization of the second stage 142. For example, a belief-propagation flooding schedule iteration may be extracted from the output of the bit-flipping stage 140, which may improve decoding performance at the second stage 142 under certain BER conditions. To illustrate, a count of unsatisfied check nodes connected to each variable node may be extracted from the bit-flipping stage 140 and used to correct each variable node value at the first iteration of the second stage 142, according to the formula $$Q_v = \text{sign}(Q_{in}) * (|Q_{in}| - R_{cv}(2S_v - d_v))$$

where $d_v$ is the degree of the variable node v, $S_v$ is the number of unsatisfied check nodes connected to the variable node v, $Q_{in}$ is the value received from the channel (e.g., the value of the variable node v in the received data 138), $Q_v$ is the new value calculated to be input to the second stage 142 as the value of the variable node v, and $R_{cv}$ is the message from the check nodes connected to the variable node v. The $R_{cv}$ value can be known in advance.

Similarly, a message passing scheme implemented by the decoder 126 of FIG. 1 may use a flooding schedule for a first iteration, in which in each iteration all the variable nodes, and subsequently all of the check nodes, pass new messages to their neighbors. Belief propagation decoding based on a flooding schedule may be performed as described with respect to pseudocode provided in Table 1.

TABLE 1

Initialization:
   for all $v \in V$, $c \in N(v,G)$ $Q_{vc} \leftarrow P_v$
Iteration:
   for all $c \in C$ (Pass check to variable messages)
     for all $v \in N(c,G)$
       $R_{vc} \leftarrow \varphi^{-1}(\Sigma_{v' \in N(c,G) \setminus v} \varphi(Q_{v'c}))$
     end of loop
   end of loop
   for all $v \in V$ (Pass variable to check messages)
     for all $c \in N(v, G)$
       $Q_{vc} \leftarrow P_v + \Sigma_{c' \in N(v,G) \setminus c} R_{c'v}$
     end of loop
   end of loop
   for all $v \in V$ (Compute a-posteriori LLRs)
     $Q_v \leftarrow P_v + \Sigma_{c \in N(v,G)} R_{cv}$
End of loop When processing at the bit-flipping stage 140 occurs using a first phase where $S_v$ is determined for all variable nodes in parallel, followed by a second phase where bit-flipping decisions are determined for each variable node based on the $S_v$ values, calculations of $Q_v$ for each variable node may be performed while the second phase of the bit-flipping process is ongoing. Thus, processing of bit-flipping determinations for the bit-flipping stage 140 and calculation of updated variable node values $Q_v$ for an initial iteration of the second stage 142 may be performed in parallel, with the latency of the second phase of the bit-flipping process partially or completely masking the latency of the initial belief-propagation flooding iteration. As a result, a first iteration of a full flooding schedule at the second stage 142 may be computed on-the-fly based on the initialization of the bit-flipping stage 140 decoding. Because the first iteration of the second stage 142 may be received "for free," the second stage 142 may start from a more advanced point. Although the second stage 142 may continue to use a flooding schedule after the first iteration, in other implementations the second stage 142 may switch to another schedule, such as a serial decoding schedule, after the first iteration is performed.

Figure 6:
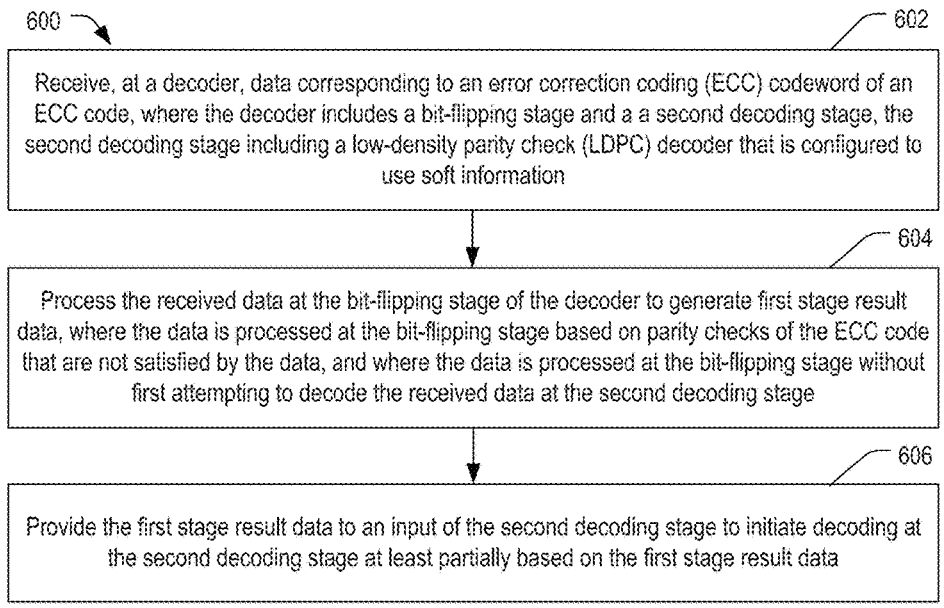
FIG. 6 is a flow chart of a particular illustrative embodiment of a method of decoding data that may be performed at the decoder of FIG. 1.

Referring to FIG. 6, a particular embodiment of a method 600 is depicted. The method 600 may be performed in a data storage device, such as the data storage device 102 of FIG. 1.

The method 600 includes receiving, at a decoder, data corresponding to an error correction coding (ECC) codeword of an ECC code, at 602. The data may match the ECC codeword (i.e., the data is error-free) or the data may be a corrupted version of the ECC codeword (i.e., the data differs from the ECC codeword due to one or more errors). The decoder includes a bit-flipping stage and a second decoding stage. The second decoding stage may include a low-density parity check (LDPC) decoder that is configured to use soft information. For example, the decoder may be the decoder 126 of FIG. 1.

The received data is processed at the bit-flipping stage of the decoder to generate first stage result data, at 604. The data is processed at the bit-flipping stage based on parity checks of the ECC code that are not satisfied by the data. The data is processed at the bit-flipping stage without first attempting to decode the received data at the second decoding stage.

The first stage result data is provided to an input of the second decoding stage to initiate decoding at the second decoding stage at least partially based on the first stage result data, at 606. For example, the first stage result data may include first stage reliability data generated by the bit-flipping stage, such as the first stage reliability data 154 of FIG. 1. Bit values from the received data 138 of FIG. 1 may be provided as initial bit values to the input of the second stage 142 of the decoder 126 of FIG. 1, and the first stage reliability data 154 may be provided as "soft" information to the input of the second stage 142 of the decoder 126 of FIG. 1.

As another example, the first stage result data may include first stage bit values generated by the bit-flipping stage, such as the first stage bit values 152 of FIG. 1. The first stage bit values 152 may be provided as input bit values to the second stage 142 of the decoder 126. In some implementations, reliability data may be received in the received data 138 and provided as "soft" information to the second stage 142. In other implementations, the first stage reliability data 154 may be provided as the "soft" information to the input of the second stage 142 of the decoder 126.

Processing data at the bit-flipping stage may include serially scanning bit values of the received data to determine whether to change a corresponding bit value for each bit position, such as described with respect to the graphs 200, 220, and 230 of FIG. 2. Processing at the bit-flipping stage of the decoder may be terminated in response to a threshold number of iterations of the serial scanning having been performed. For example, the threshold number of iterations may be 1, 2, 3, or any other number of iterations.

In some implementations, serially scanning the bit values includes mapping the bit values of the received data to values of variable nodes of the decoder, such as the variable nodes 202 illustrated in FIG. 2. Serially scanning the bit values may also include determining, for one or more of the variable nodes, whether to change the value of the variable node based on a comparison of a metric to a threshold number. The metric may be determined based on unsatisfied check nodes that are responsive to the variable node. For example, the metric may be a count of the unsatisfied check nodes. As another example, the metric may be a weighted sum corresponding to the unsatisfied check nodes. The weighted sum may be determined by generating, for each particular unsatisfied check node of the unsatisfied check nodes, a product of a value of the particular unsatisfied check node and a weight that corresponds to the particular unsatisfied check node. The generated products may be summed to obtain the weighted sum.

The corresponding threshold number may be determined according to one or more of a variety of techniques, such as described with respect to FIG. 2. For example, the corresponding threshold number may be determined dynamically, such as at least partially based on a reliability value. For example, the corresponding threshold number may be computed in accordance with Equation (1). As another example, the corresponding threshold number may be selected from precomputed sets of threshold values at least partially based on an estimated bit error rate. To illustrate, the estimated bit error rate may be estimated according to an initial syndrome weight at an early stage of decoding.

The serial scanning process may include processing of more than one variable node at a time, such as described with respect to the group of nodes 242 of the fourth graph 240 of FIG. 2. When multiple variable nodes are processed as a group, the metric for one variable node may exclude at least one check node that is responsive to the variable node and that is further responsive to a second variable node. For example, the metric for the variable node Vb in the fourth graph 240 of FIG. 2 may exclude the check node Cd because the check node Cd is also responsive to the variable node Vc. A second metric corresponding to the second variable node may also exclude the at least one check node.

In some implementations, the method 600 includes providing an updated count of the unsatisfied check nodes corresponding to each of the variable nodes to the second stage to enable updating of values of the variable nodes during an initial iteration of decoding using the updated counts of the unsatisfied check nodes from the bit-flipping stage. For example, as described above with respect to a two-phase operation of the bit-flipping stage 140, an initial flooding iteration of the second stage 142 may be performed based on $S_v$ values that are determined during the first phase of the bit-flipping stage 140. The initial flooding iteration may be performed concurrently with the second phase of the bit-flipping stage 140.

In some implementations, the second stage decoder is an LDPC decoder implementing belief-propagation. A first iteration of the bit-flipping stage may be equal to the first iteration of the belief-propagation LDPC decoder. The first stage result data that is used as input to the second decoding stage may be the result of the first iteration of the bit-flipping stage. The schedule used by the first iteration of the belief-propagation LDPC decoder may be a flooding schedule.

Figure 7:
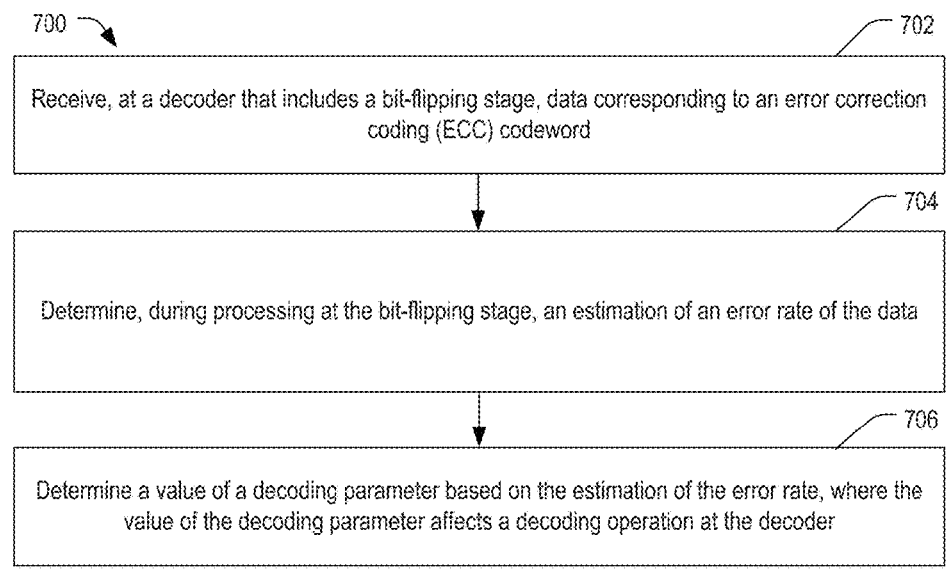
FIG. 7 is a flow chart of another particular illustrative embodiment of a method of decoding data that may be performed at the decoder of FIG. 1.

Referring to FIG. 7, a particular embodiment of a method 700 is depicted. The method 700 may be performed in a data storage device, such as the data storage device 102 of FIG. 1.

The method 700 includes receiving, at a decoder that includes a bit-flipping stage, data corresponding to an error correction coding (ECC) codeword, at 702. For example the data may be the received data 138 received at the bit-flipping stage 140 of FIG. 1.

During processing at the bit-flipping stage, an estimation of an error rate of the data is determined, at 704, and a value of a decoding parameter is determined based on the estimation of the error rate, at 706. The value of the decoding parameter affects a decoding operation at the decoder.

For example, in some implementations, thresholds used for bit-flipping decisions may be calculated on-line based on estimated bit error rate (BER). Processing at the bit-flipping stage includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node, and the threshold number may be determined based on the value of the decoding parameter, which may be determined based on the error rate.

As another example, in some implementations, a set of pre-defined thresholds may be selected from different sets of pre-defined thresholds based on estimated BER. Processing at the bit-flipping stage includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node, and the threshold number may be selected from a set of threshold numbers based on the value of the decoding parameter.

As another example, in some implementations, a threshold (e.g., maximum) number of iterations for decoding at the bit-flipping stage and/or for decoding at a second stage (e.g., the second stage 142 of FIG. 1) may be set based on estimated BER. To illustrate, the value of the decoding parameter may correspond to a threshold number of processing iterations of the bit-flipping stage. The decoder may be configured to terminate the processing at the bit-flipping stage in response to a comparison of a number of processing iterations of the bit-flipping stage to the threshold number of processing iterations. In addition, or alternatively, the decoder may include a second decoding stage that includes a low-density parity check (LDPC) decoder that is configured to use soft information. First stage result data of the bit-flipping stage, such as the first stage result data 150 of FIG. 1, may be provided to the second decoding stage for decode processing. The value of the decoding parameter may correspond to a threshold number of processing iterations of the second decoding stage. The decoder may be configured to terminate the decode processing at the LDPC decoder in response to a comparison of a number of processing iterations of the LDPC decoder to the threshold number of processing iterations.

As another example, in some implementations, initial reliabilities (e.g., LLRs) for decoding at a second stage (e.g., the second stage 142 of FIG. 1) may be determined based on estimated BER. The second decoding stage may include a low-density parity check (LDPC) decoder that is configured to use soft information. First stage result data of the bit-flipping stage may be provided to the second decoding stage for decode processing, and the value of the decoding parameter may correspond to initial reliability information provided to the LDPC decoder.

Figure 8:
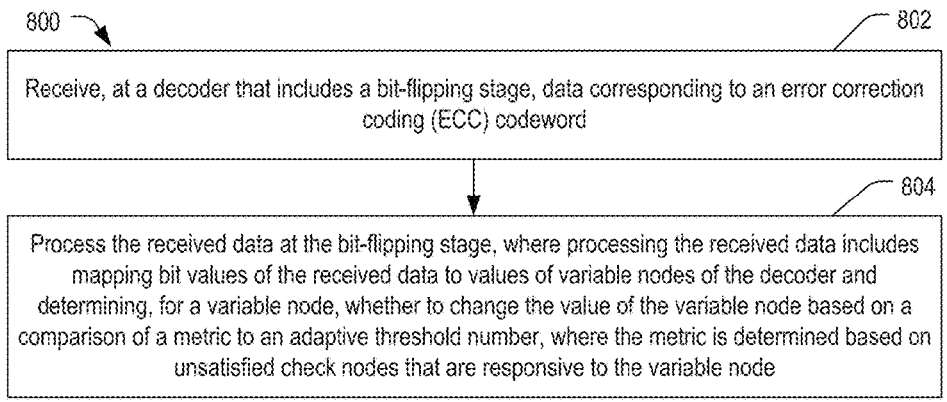
FIG. 8 is a flow chart of another particular illustrative embodiment of a method of decoding data that may be performed at the decoder of FIG. 1.

Referring to FIG. 8, a particular embodiment of a method 800 is depicted. The method 800 may be performed in a data storage device, such as the data storage device 102 of FIG. 1.

The method 800 includes receiving, at a decoder that includes a bit-flipping stage, data corresponding to an error correction coding (ECC) codeword, at 802. For example the data may be the received data 138 received at the bit-flipping stage 140 of FIG. 1.

The received data is processed at the bit-flipping stage, at 804. Processing the received data includes mapping bit values of the received data to values of variable nodes of the decoder and determining, for a variable node, whether to change the value of the variable node based on a comparison of a metric to an adaptive threshold number. The metric is determined based on unsatisfied check nodes that are responsive to the variable node.

The adaptive threshold number may be determined online or offline. For example, the adaptive threshold number may be calculated during the processing of the received data at the bit-flipping stage. As another example, the adaptive threshold number may be selected from a set of threshold numbers. The adaptive threshold number may be determined based on an estimated error rate of the data, such as an estimated BER.

The adaptive threshold number may be determined based on bad-column indices. For example, the adaptive threshold number may be determined at least partially based on information corresponding to columns of storage elements of a memory of the data storage device that are identified as being unreliable, such as indicated in the BC-RAM 172 of FIG. 1.

The adaptive threshold number may be determined at least partially based on soft bit information that is read from a memory of the data storage device. For example, the adaptive threshold number may be at least partially based on soft bit data in the SB-RAM 170 of FIG. 1.

The adaptive threshold number may be defined for each group of variable nodes that correspond to the same copy in the lifting structure in a QC-LDPC structure. For example, the variable nodes may be connected to check nodes according to a lifted quasi-cyclic low-density parity check (QC-LDPC) structure such as depicted in the graph 410 of FIG. 4. The variable nodes may be grouped according to which variable nodes correspond to a common copy of the lifted QC-LDPC structure, and a distinct adaptive threshold number may be determined for each of the groups of the variable nodes.

Figure 9:
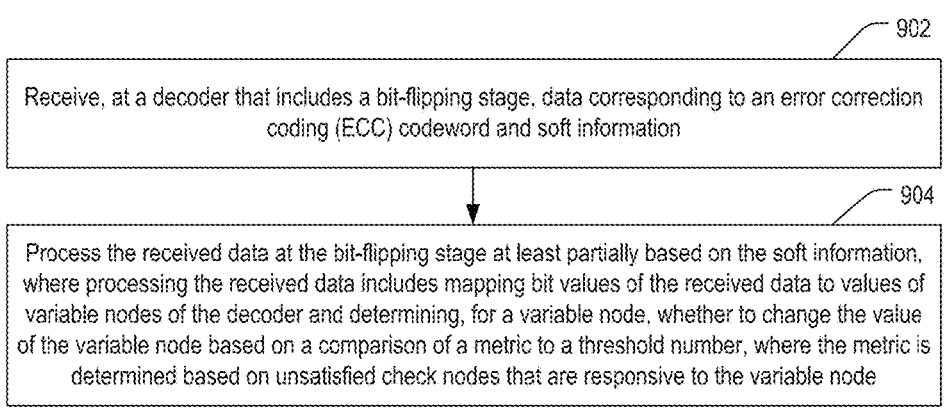
FIG. 9 is a flow chart of another particular illustrative embodiment of a method of decoding data that may be performed at the decoder of FIG. 1.

Referring to FIG. 9, a particular embodiment of a method 900 is depicted. The method 900 may be performed in a data storage device, such as the data storage device 102 of FIG. 1.

The method 900 includes receiving, at a decoder that includes a bit-flipping stage, data corresponding to an error correction coding (ECC) codeword and soft information, at 902. For example the data may be received at the bit-flipping stage 140 of FIG. 1.

The received data is processed at the bit-flipping stage at least partially based on the soft information, at 904. Processing the received data includes mapping bit values of the received data to values of variable nodes of the decoder and determining, for a variable node, whether to change the value of the variable node based on a comparison of a metric to a threshold number. The metric may be determined based on unsatisfied check nodes that are responsive to the variable node. The soft information may include information corresponding to columns of storage elements of a memory of the data storage device that are identified as being unreliable, such as information provided to the BC-RAM 172 of FIG. 1. Alternatively, or in addition, the soft information may include soft bit information that is read from a memory of the data storage device, such as information provided to the SB-RAM 170 of FIG. 1. The threshold number may be determined at least partially based on the "bad column" information and/or the soft bit information.

Figure 10:
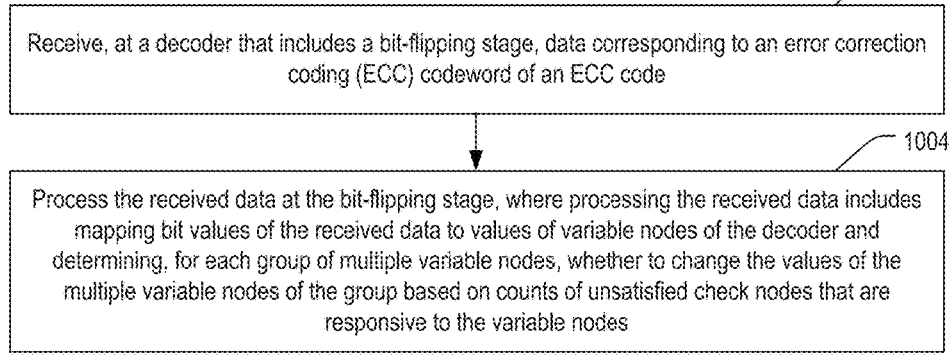
FIG. 10 is a flow chart of another particular illustrative embodiment of a method of decoding data that may be performed at the decoder of FIG. 1.

Referring to FIG. 10, a particular embodiment of a method 1000 is depicted. The method 1000 may be performed in a data storage device, such as the data storage device 102 of FIG. 1. The method 1000 includes receiving, at a decoder that includes a bit-flipping stage, data corresponding to an error correction coding (ECC) codeword, at 1002. For example the data may be received at the bit-flipping stage 140 of FIG. 1.

The received data is processed at the bit-flipping stage, at 1004. Processing the received data includes mapping bit values of the received data to values of variable nodes of the decoder and determining, for each group of multiple variable nodes, whether to change the values of the multiple variable nodes of the group based on counts of unsatisfied check nodes that are responsive to the variable nodes. For example, determining whether to change the values may be performed as described with respect to the fourth graph 240 of FIG. 2. The decoder may also include a second decoding stage that includes a low-density parity check (LDPC) decoder that is configured to use soft information, such as the second stage 142 of FIG. 1. First stage result data generated at the bit-flipping stage may be provided to an input of the second decoding stage to initiate decoding at the second decoding stage at least partially based on the first stage result data.

Figure 11:
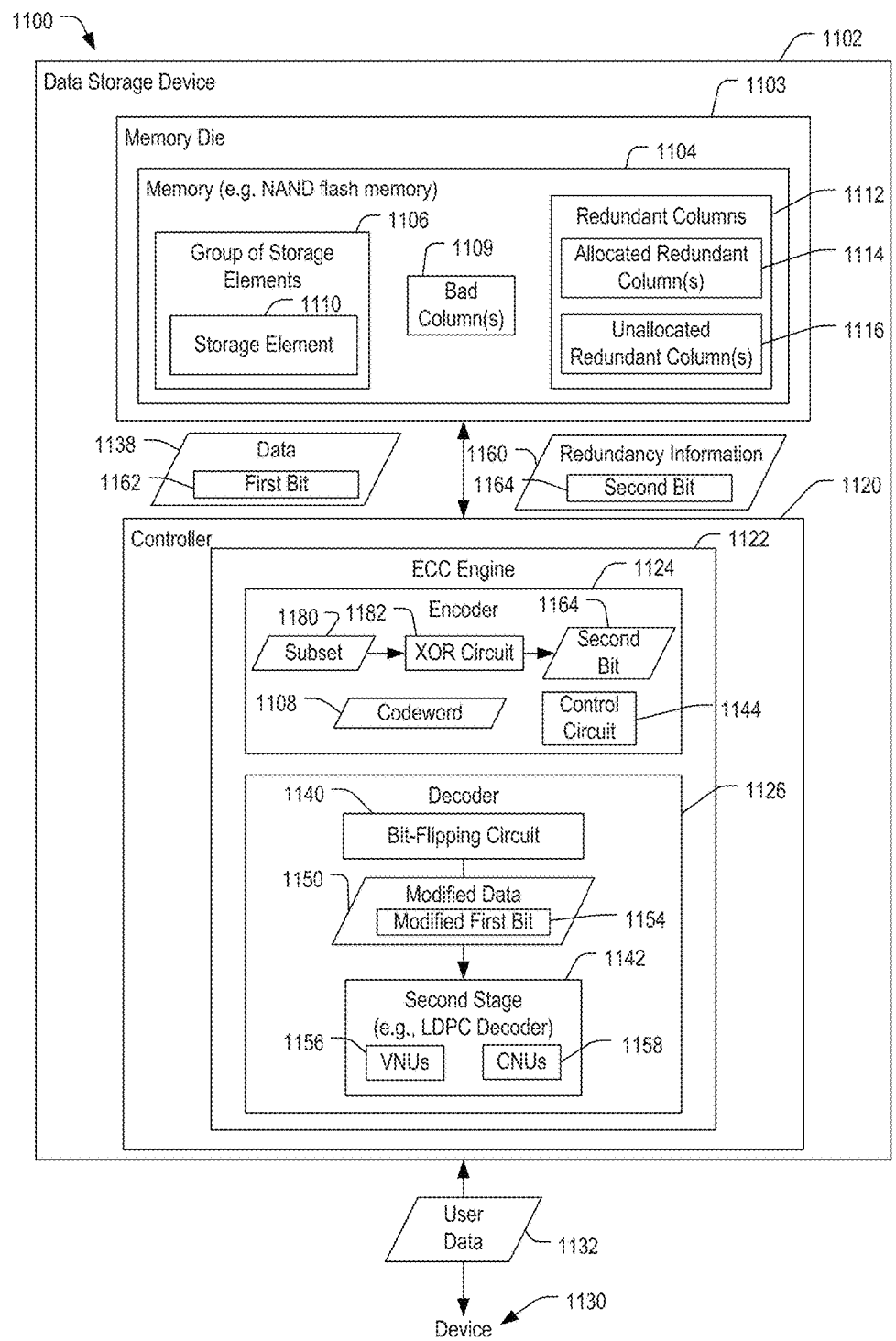
FIG. 11 is a block diagram of another particular illustrative embodiment of a system including a data storage device having a decoder that includes a bit-flipping circuit and a second stage.

Referring to FIG. 11, a particular embodiment of a system 1100 includes a data storage device 1102 coupled to a device 1130 (e.g., a host device or an access device). The data storage device 1102 includes a controller 1120 configured to receive data 1138 read from a memory 1104 that includes a group of storage elements 1106 (e.g., a word line of storage elements) and one or more unallocated redundant columns 1116. The controller 1120 is also configured to receive redundancy information 1160 sensed from the one or more unallocated redundant columns 1116 and to determine a value of a first bit 1162 of the data 1138 based on parity check conditions associated with a second bit 1164 of the redundancy information 1160. In an illustrative example, the second bit 1164 has a degree of one, as explained further with reference to FIGS. 13 and 14.

A number of the one or more unallocated redundant columns 1116 is based on a number of one or more bad columns 1109 of a memory die 1103. For example, the memory die 1103 may include redundant columns 1112 having one or more allocated redundant columns 1112 that are allocated to replace (or "swapped" in place of) the one or more bad columns 1109 and may further include one or more "unused" or "extra" redundant columns (e.g., the one or more unallocated redundant columns 1116).

The controller 1120 includes an ECC engine 1122 including an encoder 1124, such as an LDPC encoder. The ECC engine 1122 may include an exclusive-or (XOR) circuit 1182 configured to perform bitwise XOR operations. The encoder 1124 may also include a control circuit 1144.

The ECC engine 1122 further includes a decoder 1126. The decoder 1126 includes a bit-flipping circuit 1140 (e.g., a preliminary bit-flipping stage) that is coupled to a second stage 1142, such as an LDPC decoder. The second stage 1142 may include multiple VNUs 1156 and multiple CNUs 1158. The second stage 1142 may include a high-power (or "full-power") decoder associated with a higher power consumption than the bit-flipping circuit 1140.

During operation, the data storage device 1102 may receive user data 1132 from the device 1130 in connection with a request for write access to the memory 1104. In response to receiving the user data 1132, the controller 1120 may initiate an encoding process (e.g., an LDPC encoding process) to encode the user data 1132. For example, the controller 1120 may input the user data 1132 to the encoder 1124 to initiate the encoding process.

The encoder 1124 may encode the user data 1132 to generate encoded data, such as a codeword 1108 (e.g., an LDPC codeword). For example, the encoder 1124 may encode the user data 1132 in accordance with an LDPC encoding technique to generate the codeword 1108.

The encoder 1124 may be configured to generate redundancy information 1160 based on the codeword 1108. For example, the encoder 1124 may be configured to select subsets of bits of the codeword 1108 (such as a representative subset of bits 1180) and to generate a parity bit for each of the subsets of bits using a XOR operation. As an illustrative example, the control circuit 1144 may be configured to select a subset of bits 1180 of the codeword 1108, and the subset of bits 1180 may include the first bit 1162. The control circuit 1144 may be configured to perform an XOR operation based on the subset of bits 1180 to generate the second bit 1164.

In an illustrative example, the codeword 1108 includes N bits, and the control circuit 1144 is configured to select U subsets each including N/U bits of the codeword 1108 (where N and U are positive integers, and where N>U). The redundancy information 1160 may include U bits (where each of the U bits corresponds to a particular subset selected by the control circuit 1144). The control circuit 1144 may be configured to select the subset of bits 1180 by selecting each Uth bit of the codeword 1108. As a non-limiting illustrative example, if U=512, then the control circuit 1144 may be configured to select bits 0, 512, 1024, . . . (N–U) of the codeword 1108.

The controller 120 may be configured to send the codeword 1108 and the redundancy information 1160 to the memory die 1103 to be stored at the memory 1104. For example, the codeword 1108 may be stored at the group of storage elements 1106, and the redundancy information 1160 may be stored at the unallocated redundant columns 1116.

In some cases, the group of storage elements 1106 may include one or more storage elements included in the one or more bad columns 1109, such as a representative storage element 1110 of a bad column of the one or more bad columns 1109. In this example, a storage element of a particular column of the one or more allocated redundant columns may "replace" the storage element 1110 (e.g., by storing a particular bit of the codeword 1108 that is targeted for the storage element 1110).

After writing the codeword 1108 and the redundancy information 1160 to the memory 1104, data storage device 1102 may initiate a read process to access the codeword 1108 and the redundancy information 1160. For example, the data storage device 1102 may receive a request for read access to the codeword 1108 from the device 1130, and the controller 1120 may send a read command to the memory die 1103 indicating a physical address of the group of storage elements 1106.

The memory die 1103 may be configured to access the group of storage elements 1106 and the redundant columns 1112 in response to the read command. For example, the read command may cause the memory die 1103 to sense the group of storage elements 1106 to generate a representation of the codeword 1108, such as the data 1138. In some cases, the data 1138 may differ from the codeword 1108 due to one or more bit errors. For example, a value of the first bit 1162 of the data 1138 may be "wrong" due to a bit error.

The memory die 1103 may also sense a set of storage elements (e.g., a row) of the redundant columns 1112 (e.g., to generate the redundancy information 1160 or a representation of the redundancy information 1160). For example, the set of storage elements of the redundant columns 1112 may include a storage element of the allocated redundant columns 1114 that "replaces" the storage element 1110 of the one or more bad columns 1109. In some implementations, the memory die 1103 may include a circuit that "re-routes" operations targeting the storage element 1110 to the storage element of the allocated redundant column that replaces the storage element 1110. For example, in some implementations, the circuit may include one or more of a fuse or an anti-fuse that connects a latch of the memory die 1103 to the storage element of the one or more allocated redundant columns 1114 (instead of to the storage element 1110).

The controller 1120 is configured to receive the data 1138 and the redundancy information 1160 from the memory die 1103. The controller 1120 may initiate a decoding process (e.g., an LDPC decoding process) to decode the data 1138 using the redundancy information 1160. For example, the controller 1120 may input the data 1138 and the redundancy information 1160 to the decoder 1126 to initiate the decoding process.

The bit-flipping circuit 1140 is configured to selectively determine (e.g., modify) one or more values of bits of the data 1138 based the redundancy information 1160. For example, the bit-flipping circuit 1140 may determine a value of the first bit 1162 based on one or more parity check conditions associated with the second bit 1164. The bit-flipping circuit 1140 may be configured to selectively modify the value of the first bit 1162 from a first logic value (e.g., one of a logic zero value or a logic one value) to a second logic value (e.g., the other of the logic zero value or the logic one value) based on the one or more parity check conditions.

To illustrate, because the second bit 1164 is generated using an operation (e.g., a XOR operation) based on the subset of bits 1180, the bit-flipping circuit 1140 may modify the value of the first bit 1162 in response to determining that the modified value satisfies the operation. As a non-limiting illustrative example, the subset of bits 1180 may include three bits (e.g., the first bit 1162 and two other bits) each having a value of zero. Accordingly, the second bit 1164 may have a value of zero (because 0⊕0⊕0=0 in this illustrative example). If an error causes the first bit 1162 to indicate a value of one (and the other bits of the subset of bits 1180 and the second bit 1164 each indicate a value of zero), then the bit-flipping circuit 1140 may determine that modifying the value of the first bit 1162 (e.g., from one to zero) to generate a modified first bit 1154 satisfies the XOR operation (i.e., 0⊕0⊕0=0 in this example).

Alternatively or in addition, the bit-flipping circuit 1140 may be configured to modify the value of the first bit 1162 in response to determining that a number of unsatisfied check nodes associated with the first bit 1162 exceeds a threshold. As an example, the first bit 1162 may be associated with N check nodes (e.g., as indicated by a parity check matrix), where N is a positive integer, and the threshold may correspond to N/2. To further illustrate, if N=3, then the bit-flipping circuit 1140 may modify the value of the first bit 1162 in response to determining that the first bit 1162 is associated with two unsatisfied check nodes.

The bit-flipping circuit 1140 may generate modified data 1150 that includes the modified first bit 1154. The bit-flipping circuit 1140 may provide the modified data 1150 to the second stage 1142.

The second stage 1142 is configured to receive the modified data 1150 from the bit-flipping circuit 1140 and to initiate a decoding process to decode the modified data 1150 using the modified value of the first bit 1162. For example, second stage 1142 may include a decoder stage, such as an LDPC decoder that performs LDPC decoding in accordance with a parity check matrix. An illustrative example of a parity check matrix is described further with reference to FIG. 12.

In some implementations, the second stage 1142 is configured to detect decoding convergence of decoding the modified data 1150 (e.g., to detect that the modified data 1150 corresponds to the codeword 1108 after correcting one or more errors of the modified data 1150) independently of satisfaction of check equations corresponding to the redundancy information 1160. To illustrate, after the bit-flipping circuit 1140 provides the modified data 1150 to the second stage 1142, the second stage 1142 may decode the modified data 1150 independently of the redundancy information 1160. In this example, if the second bit 1164 includes an error, the second bit 1164 may not be corrected during decoding. In other implementations, the bit-flipping circuit 1140 may be configured to provide the redundancy information 1160 to the second stage 1142, and the second stage 1142 may be configured to use the redundancy information 1160 in connection with decoding of the modified data 1150. As an illustrative example, the second stage 1142 may be configured to determine whether the second bit 1164 is associated with an error (e.g., based on one or more parity check conditions, such as the one or more parity check conditions described above) and to modify a value of the second bit 1164 in response to determining that the second bit 1164 is associated with an error.

In some implementations, the controller 1120 may be configured to determine (e.g., vary) a data size of redundancy information, such as the redundancy information 1160. For example, the controller 1120 may be configured to use fewer than all of the unallocated redundant columns 1116 for storage of redundancy information. In this case, the redundancy information 1160 may include a number of bits that is less than a number of columns of the unallocated redundant columns 1116.

FIG. 11 illustrates that the data storage device 1102 may use the redundancy information 1160 to improve device performance without increasing power consumption or decoding time by used the decoder 1126. For example, by using the bit-flipping circuit 1140 to change the value of the first bit 1162 based on the second bit 1164, the first bit 1162 may be corrected prior to initiating decoding by the second stage 1142. Further, in some implementations, decoding convergence is detected by the second stage 1142 independently of the second bit 1164. Thus, performance may be improved without increasing power consumption or decoding time by used the decoder 1126.

Figure 12:
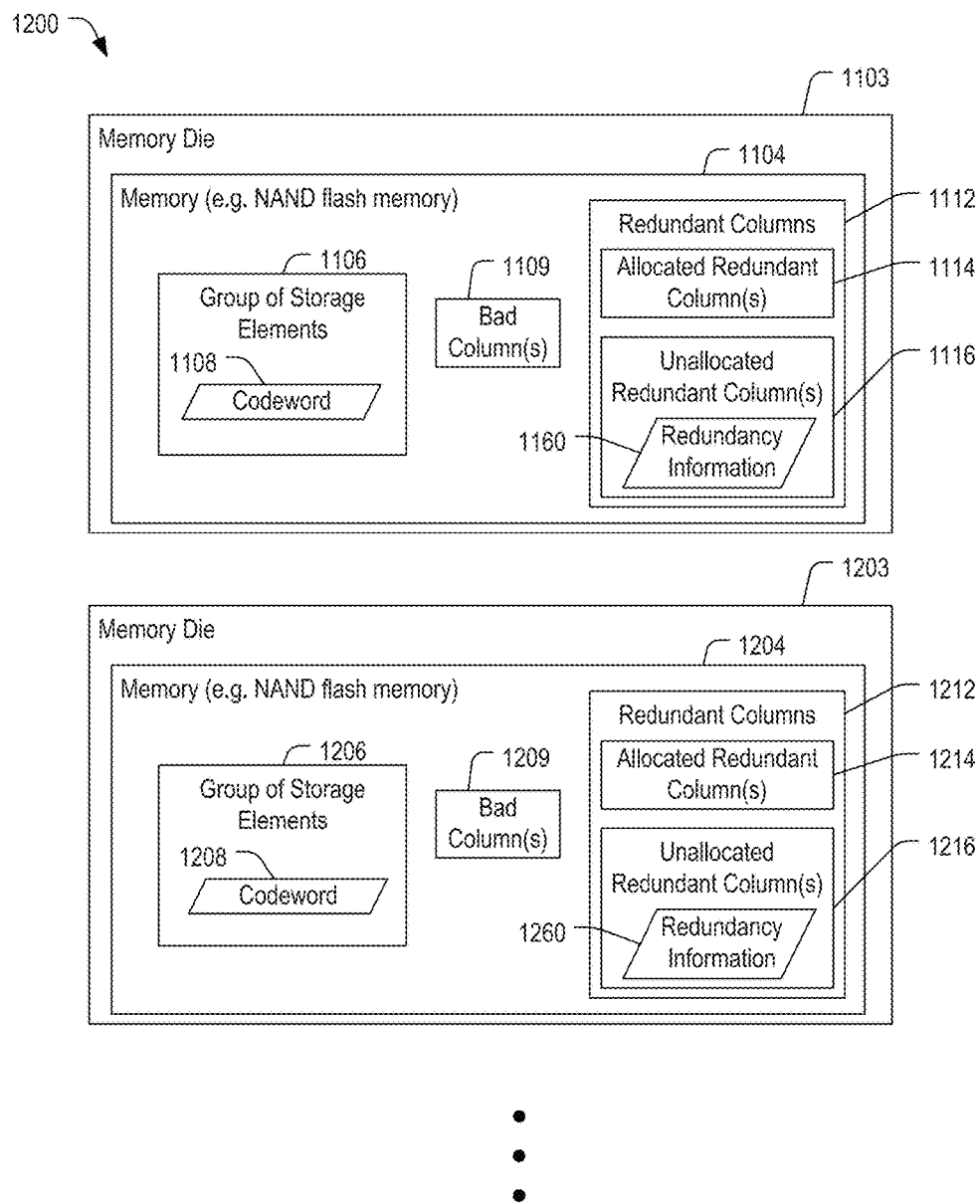
FIG. 12 is a block diagram illustrating an example of multiple memory dies that may be included in the data storage device of FIG. 12.

FIG. 12 illustrates an example of multiple memory dies 1200 that may be included in the data storage device 1102 of FIG. 11. The multiple memory dies 1200 include the memory die 1103. The multiple memory dies 1200 may be coupled to the controller 1120 of FIG. 11.

The multiple memory dies 1200 further include a second memory die 1203. The second memory die 1203 may include a memory 1204 having a group of storage elements 1206 (e.g., a word line of storage elements). The memory 1204 may also include redundant columns 1212 to replace one or more bad columns 1209 of the memory 1204. For example, the redundant columns 1212 may include one or more allocated redundant columns 1214 to "replace" the one or more bad columns 1209 and may also include one or more unallocated redundant columns 1216, such as "unused" or "extra" redundant columns that do not replace bad columns of the memory 1204. The one or more unallocated redundant columns 1216 may be configured to store second redundancy information 1260 associated with a second codeword 1208 that is stored at the group of storage elements 1206.

In some cases, a number of the one or more bad columns 1109 may be different than a number of the one or more bad columns 1209, such as due to variations in a fabrication process used to fabricate the memory dies 1103, 1203, or if the memory dies 1103, 1203 are fabricated using different fabrication processes. As a result, a number of the one or more unallocated redundant columns 1216 may be different than a number of the one or more unallocated redundant columns 1216. Thus, an amount of redundancy information (e.g., the redundancy information 1160) stored by the unallocated redundant columns 1116 may be different than an amount of redundancy information (e.g., the second redundancy information 1260) stored by the unallocated redundant columns 1216. In this case, the second redundancy information 1260 may have a data size (e.g., a number of bits) that is different than a data size of the redundancy information 1160.

FIG. 12 illustrates that an amount of redundancy information stored at unallocated memory dies may be selected based on a particular memory die (e.g., based on a particular number of bad columns of a memory die). Thus, data storage efficiency may be improved by using available storage elements of a memory die.

Figure 13:
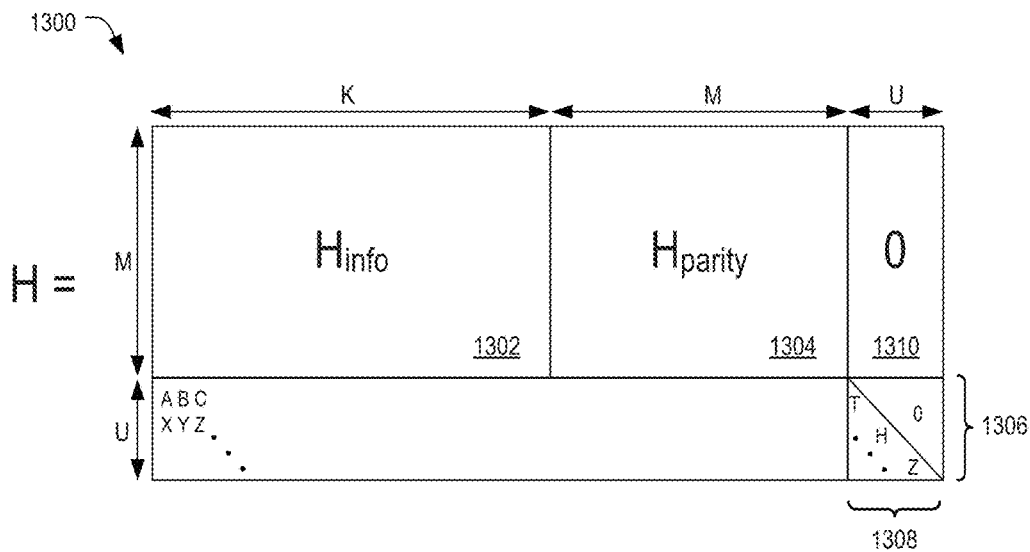
FIG. 13 is a diagram illustrating an example of a parity check matrix that may be associated with encoding operations performed by a data storage device, such as the data storage device of FIG. 11.

Referring to FIG. 13, a particular illustrative example of a parity check matrix (H) is depicted and generally designated 1300. The parity check matrix 1300 may correspond to the encoder 1124 of FIG. 11. For example, the encoder 1124 may encode the user data 1132 based on the parity check matrix 1300 to generate the codeword 1108.

The parity check matrix 1300 includes an information portion 1302 (H info) and a parity portion 1304 (H_parity). The parity portion 1304 includes M rows and K columns, and the parity portion 1304 includes M rows and M columns (where M and K correspond to positive integers).

FIG. 13 also illustrates that the parity check matrix 1300 may include one or more additional rows and one or more additional columns that may be used to generate the redundancy information 1160 to be stored at the unallocated redundant columns 1116 of FIG. 11. For example, FIG. 13 illustrates that the parity check matrix 1300 may include one or more rows 1306 and one or more columns 1308 (in addition to the information portion 1302 and the parity portion 1304). The one or more rows 1306 may include U rows, and the one or more columns 1308 may include U columns (where U indicates a positive integer). The one or more columns 1308 may include a null portion 1310 (e.g., an all zero portion). In the example of FIG. 13, the entries A, B, C, X, Y, Z, T, or H may each represent either a logic one value or a logic zero value. A decoding process performed by the second stage 1142 may be independent of the one or more rows 1306 and the one or more columns 1308.

U may indicate a positive integer greater than or equal to one. Further, U may correspond to (e.g., may be selected based on) a number of columns of the unallocated redundant columns 1116. For example, each column of the one or more columns 1308 may correspond to a particular bit of the redundancy information 1160. Each column of the one or more columns 1308 may correspond to a variable node, as described further with reference to FIG. 14.

A dimension of the parity check matrix 1300 may be based on a number of bits of the codeword 1108 and a number of bits of the redundancy information 1160. For example, the number of bits of the codeword 1108 may correspond to K+M, and the number of bits of the redundancy information 1160 may correspond to U.

In an illustrative implementation, the parity check matrix 1300 enables the encoder 1124 to generate one or more parity bits (e.g., the second bit 1164) having a degree of one. For example, if a particular column of the one or more columns 1308 includes a single one value, then a parity bit generated by the encoder 1124 based on the particular column may be associated with a single parity condition (e.g., a variable node associated with the parity bit may be connected to a single check node). In an illustrative example, the one or more rows 1306 include a "checkerboard" set of one entries and zero entries (e.g., where the entries A, Y, and C are one entries, and where the entries X, B, and Z are zero entries). In another illustrative example, each entry of a particular row of the one or more rows 1306 is a one entry, and each entry of each other row of the one or more rows 1306 is a zero entry.

FIG. 13 illustrates that the parity check matrix 1300 may include a column of the one or more columns 1308 that is associated with a variable node that is not connected to check nodes associated with the information portion 1302 and the parity portion 1304. A bit (e.g., the second bit 1164) may be associated with the variable node. The bit may be used by the bit-flipping circuit 1140 (e.g., according to parity check conditions specified by the check node that is connected to the variable node) while enabling the second stage 1142 to perform decoding independently of the bit (since for example the null portion 1310 may ensure that check nodes associated with the information portion 1302 and the parity portion 1304 are not connected to the variable node).

Figure 14:
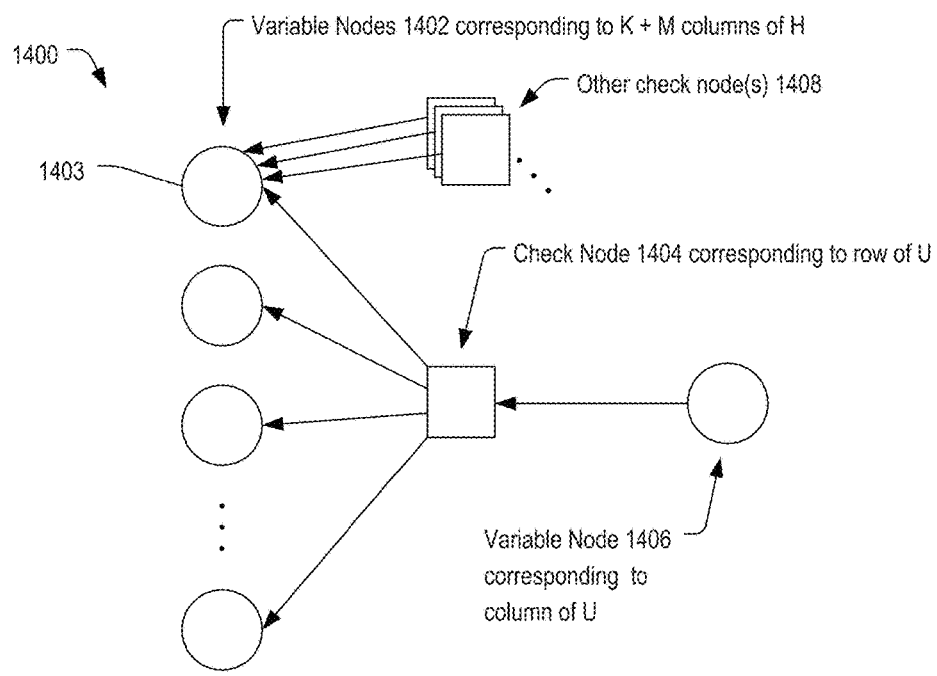
FIG. 14 is a diagram illustrating an example of a graph including check nodes and variable nodes that may be associated with the parity check matrix of FIG. 13.

Referring to FIG. 14, an illustrative example of a graph is depicted and generally designated 1400. The graph may be associated with the parity check matrix 1300 of FIG. 13

The graph 1400 includes variable nodes 1402, such as a representative variable node 1403. The variable nodes 1402 may correspond to the multiple VNUs 1156. The variable nodes 1402 may correspond to columns of the information portion 1302 and the parity portion 1304 of the parity check matrix 1300. For example, the variable nodes 1402 may include K+M variable nodes corresponding to the K+M columns of the portions 1302, 1304 of the parity check matrix 1300.

The graph 1400 also includes a check node 1404 corresponding to a particular row of the one or more rows 1306. FIG. 14 also depicts that the graph 1400 includes a variable node 1406 corresponding to a particular column of the one or more columns 1308. The graph 1400 may also include other check nodes corresponding to rows of the information portion 1302 and the parity portion 1304 of the parity check matrix 1300. For example, the variable node 1406 may be connected to one or more check nodes 1408 corresponding to one or more rows of the portions 1302, 1304 of the parity check matrix 1300.

In an illustrative example, the variable node 1406 is connected to a single check node (e.g., the check node 1404), and the check node 1404 is connected to multiple variable nodes of the variable nodes 1402 (e.g., to each of the variable nodes 1402, as a non-limiting illustrative example). In an illustrative example, the variable node 1406 corresponds to the second bit 1164 of FIG. 11, and connections between the check node 1404 and one or more of the variable nodes 1402 correspond to one or more parity check conditions associated with the second bit 1164 (e.g., one or more check node equations). In this example, the bit-flipping circuit 1140 of FIG. 11 may determine whether to modify the value of the first bit 1162 based on the one or more parity check conditions corresponding to the connections between the check node 1404 and one or more of the variable nodes 1402.

During operation of the decoder 1126 of FIG. 11, the bit-flipping circuit 1140 may determine whether to modify a value of the first bit 1162 in accordance with the graph 1400. For example, if first bit 1162 corresponds to the variable node 1403 and the second bit 1164 corresponds to the variable node 1406, the bit-flipping circuit 1140 may modify the value of the first bit 1162 if a number of one or more unsatisfied parity check conditions associated with the variable node 1403 exceeds a threshold. In the example of FIG. 14, the variable node 1403 is associated with parity check conditions specified by the check nodes 1404, 1408. In an illustrative example, if a number of the parity check conditions that are unsatisfied is greater than a number of the parity check conditions that are satisfied, the bit-flipping circuit 1140 may modify the value of the first bit 1162. In this example, the variable node 1406 "participates" in the parity check conditions (because the check node 1404 is connected to the variable node 1406), and thus the determination of whether to modify the value of the first bit 1162 may be based on the variable node 1406 (and a value of the second bit 1164).

In connection with FIG. 14, the variable node 1406 may not be connected to check nodes associated with the information portion 1302 and the parity portion 1304 of the parity check matrix 1300 of FIG. 13. A bit (e.g., the second bit 1164) may be associated with the variable node 1406. The bit may be used by the bit-flipping circuit 1140 (e.g., according to parity check conditions specified by the check node 1404) while enabling the second stage 1142 to perform decoding independently of the bit (since for example the null portion 1310 may ensure that check nodes associated with the information portion 1302 and the parity portion 1304 are not connected to the variable node 1406).

Figure 15:
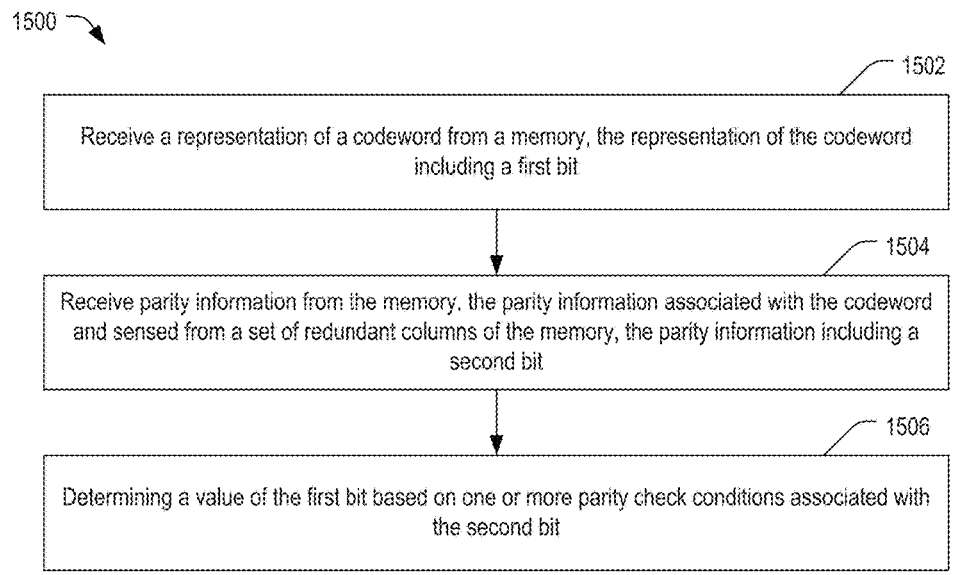
FIG. 15 is a flow chart of an illustrative embodiment of a method of decoding data that may be performed at the decoder of FIG. 11.

Referring to FIG. 15, an illustrative example of a method is depicted and generally designated 1500. The method 1500 may be performed in a data storage device (e.g., the data storage device 1102) that includes a memory (e.g., the memory 1104) and a controller (e.g., the controller 1120).

The method 1500 includes receiving a representation of a codeword from the memory, at 1502. The representation of the codeword includes a first bit. For example, the controller 1120 may receive the data 1138 (e.g., a representation of the codeword 1108) from the memory 1104, and the data 1138 may include the first bit 1162.

The method 1500 further includes receiving parity information associated with the codeword from the memory, at 1504. The parity information is sensed from a set of redundant columns of the memory and includes a second bit. To illustrate, the controller 1120 may receive the redundancy information 1160 from the memory 1104, and the redundancy information 1160 may be sensed from the unallocated redundant columns 1116. The redundancy information 1160 includes the second bit 1164.

The method 1500 further includes determining a value of the first bit based on one or more parity check conditions associated with the second bit, at 1506. For example, the bit-flipping circuit 1140 may determine the value of the first bit 1162 based on one or more parity check conditions associated with the second bit 1164.

An example of a parity check condition is a number of unsatisfied parity check equations associated with the first bit 1162. The unsatisfied parity check equations may be specified by a parity check matrix (e.g., the parity check matrix 1300) and by check nodes connected to a variable node associated with the first bit 1162. If the number of unsatisfied parity check equations satisfies a threshold, then the value of the first bit 1162 may be modified (e.g., by the bit-flipping circuit 1140). To illustrate, the first bit 1162 may be associated with N check nodes, and the threshold may correspond to N/2. In this example, the value of the first bit 1162 may be modified if a number of unsatisfied parity check equations associated with the first bit 1162 exceeds a number of satisfied parity check equations associated with the first bit 1162.

The method 1500 may improve performance of a decoder. For example, one or more bit errors may be corrected without increasing power consumption or decoding time used by a stage (e.g., the second stage 1142) of the decoder.

Figure 16:
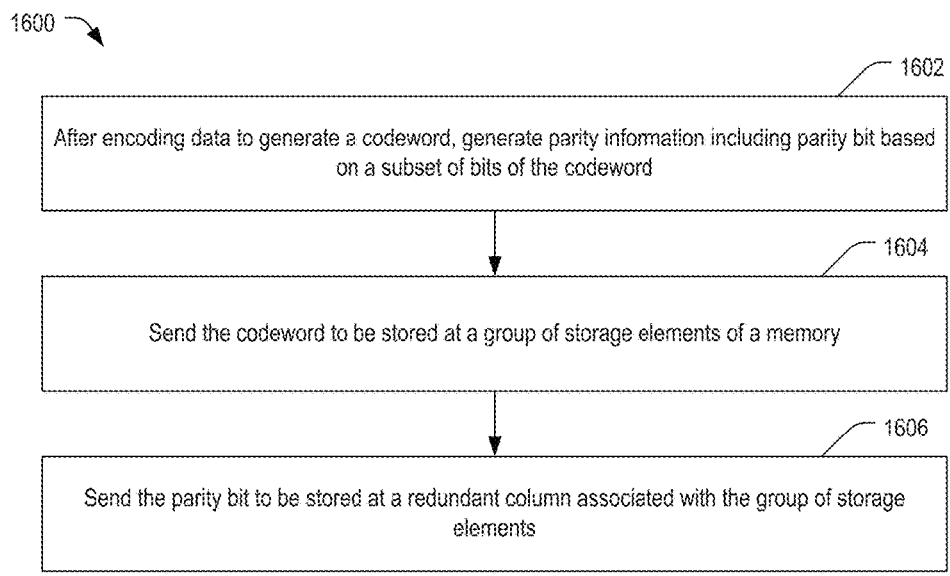
FIG. 16 is a flow chart of an illustrative embodiment of a method of encoding data that may be performed at an encoder of the data storage device of FIG. 11.

Referring to FIG. 16, an illustrative example of a method is depicted and generally designated 1600. The method 1600 may be performed in a data storage device (e.g., the data storage device 1102) that includes a memory (e.g., the memory 1104) and a controller (e.g., the controller 1120).

The method 1600 includes generating parity information including a parity bit based on a subset of bits of a codeword after encoding data to generate the codeword, at 1602. For example, the controller 1120 of FIG. 11 may encode the user data 1132 to generate the codeword 1108, and the controller 1120 may generate the redundancy information 1160 including the second bit 1164 based on the subset of bits 1180 of the codeword 1108.

The method 1600 further includes sending the codeword to be stored at a group of storage elements of the memory, at 1604. For example, the controller 1120 may send the codeword 1108 to the memory die 1103 to be stored at the group of storage elements 1106 of the memory 1104.

The method 1600 further includes sending the parity bit to be stored at a redundant column associated with the group of storage elements, at 1606. For example, the parity bit may be stored at a particular column of the one or more unallocated redundant columns 1116.

The method 1600 may enable efficient use of storage space of a device. For example, the method 1600 may improve storage space efficiency by storing redundancy data to unallocated redundant columns of a device.

Figure 17:
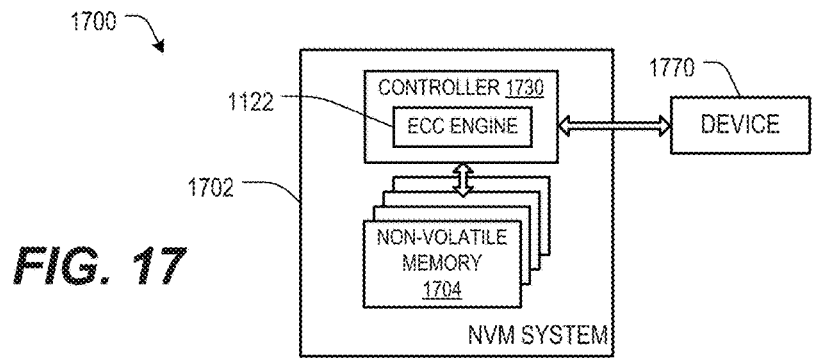
FIG. 17 is a block diagram of a particular illustrative embodiment of a non-volatile memory system that includes a data storage device, such as the data storage device of FIG. 1, the data storage device of FIG. 11, or both.

Referring to FIG. 17, a system 1700 includes a non-volatile memory system 1702 (e.g., the data storage device 102 or the data storage device 1102) that may be coupled to a device 1770 (e.g., the device 130 or the device 1130). The non-volatile memory system 1702 includes a controller 1730 (e.g., the controller 120 or the controller 1120) and non-volatile memory that may be made up of one or more non-volatile memory dies 1704. As used herein, the term "memory die" refers to the collection of non-volatile memory cells, and associated circuitry for managing the physical operation of those non-volatile memory cells, that are formed on a single semiconductor substrate. The controller 1730 interfaces with the device 1770 and transmits command sequences for read, program, and erase operations to the one or more non-volatile memory dies 1704. The controller 1730 includes the ECC engine 1122.

The controller 1730 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 1730 may be configured with hardware and/or firmware to perform the various functions described below and shown in the flow diagrams. Also, some of the components shown as being internal to the controller 1730 can be stored external to the controller 1730, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 1704 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 1730 and the one or more non-volatile memory dies 1704 may be any suitable flash interface, such as Toggle Mode 200, 400, or 800. In one embodiment, the non-volatile memory system 1702 may be a card based system, such as a secure digital (SD) or a micro secure digital (micro-SD) card. In an alternate embodiment, the non-volatile memory system 1702 may be part of an embedded memory system.

Although, in the example illustrated in FIG. 17, the non-volatile memory system 1702 (sometimes referred to herein as a storage module) includes a single channel between the controller 1730 and the one or more non-volatile memory dies 1704, the subject matter described herein is not limited to having a single memory channel. For example, in some NAND memory system architectures (such as the ones shown in FIGS. 4 and 5), 2, 4, 8 or more NAND channels may exist between the controller 1730 and the NAND memory device, depending on controller capabilities. In any of the embodiments described herein, more than a single channel may exist between the controller 1730 and the one or more non-volatile memory dies 1704, even if a single channel is shown in the drawings.

Figure 18:
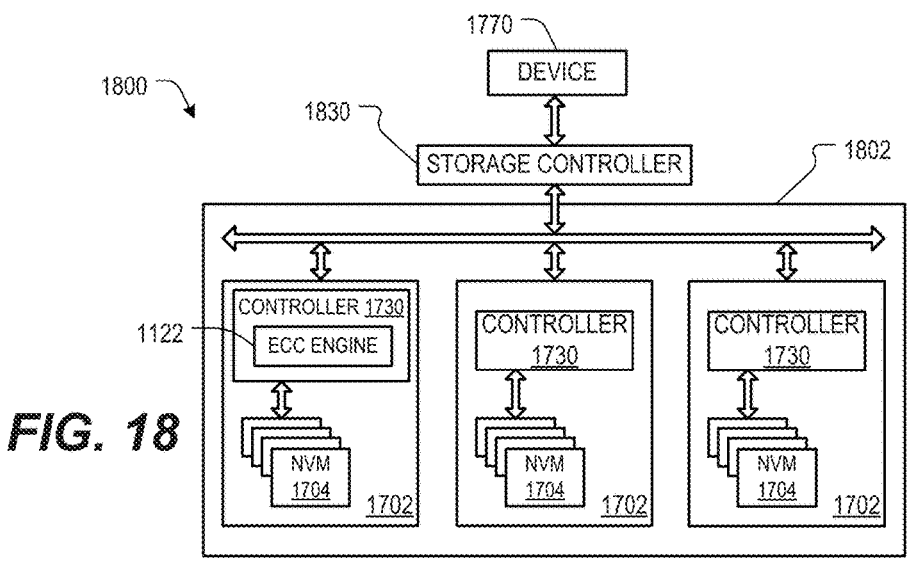
FIG. 18 is a block diagram of a particular illustrative embodiment of a storage system including a plurality of the non-volatile memory systems of FIG. 17.

FIG. 18 illustrates a storage system 1800 that includes multiple non-volatile memory systems 1702. As such, storage system 1800 may include a storage controller 1830 that interfaces with the device 1770 (e.g., a host device) and with a storage system 1802, which includes a plurality of non-volatile memory systems 1702. The interface between the storage controller 1830 and the non-volatile memory systems 1702 may be a bus interface, such as a serial advanced technology attachment (SATA) or peripheral component interface express (PCIe) interface. The storage system 1800 may correspond to a solid state drive (SSD), such as found in portable computing devices, such as laptop computers, and tablet computers. One or more of the controllers 1730 of FIG. 18 may include the ECC engine 1122. The storage controller 1830 may include the ECC engine 1122.

Figure 19:
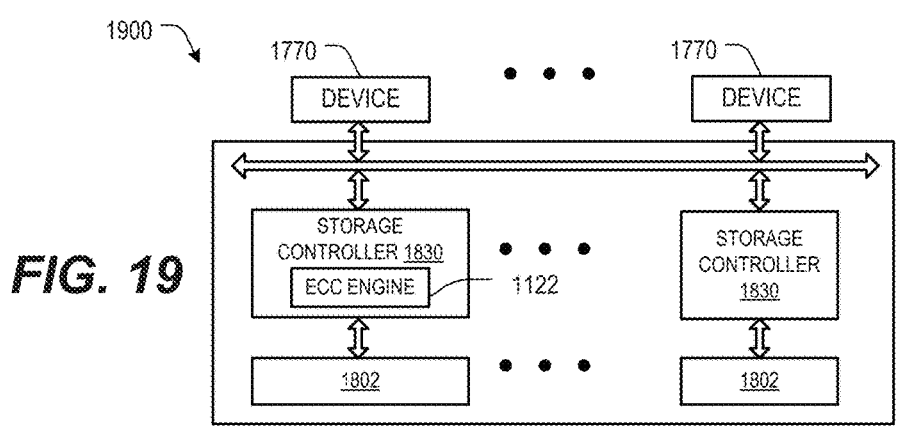
FIG. 19 is a block diagram of a particular illustrative embodiment of a hierarchical storage system that includes a plurality of the storage systems of FIG. 18.

FIG. 19 is a block diagram illustrating a hierarchical storage system 1900. The hierarchical storage system 1900 includes a plurality of storage controllers 1830, each of which controls a respective storage system 1802. Devices 1770 (e.g., one or more host devices or accessing devices) may access memories within the hierarchical storage system 1900 via a bus interface. In one embodiment, the bus interface may be an NVMe or fiber channel over Ethernet (FCoE) interface. In one embodiment, the hierarchical storage system 1900 illustrated in FIG. 19 may be a rack mountable mass storage system that is accessible by multiple host computers, such as would be found in a data center or other location where mass storage is needed.

Figure 20:
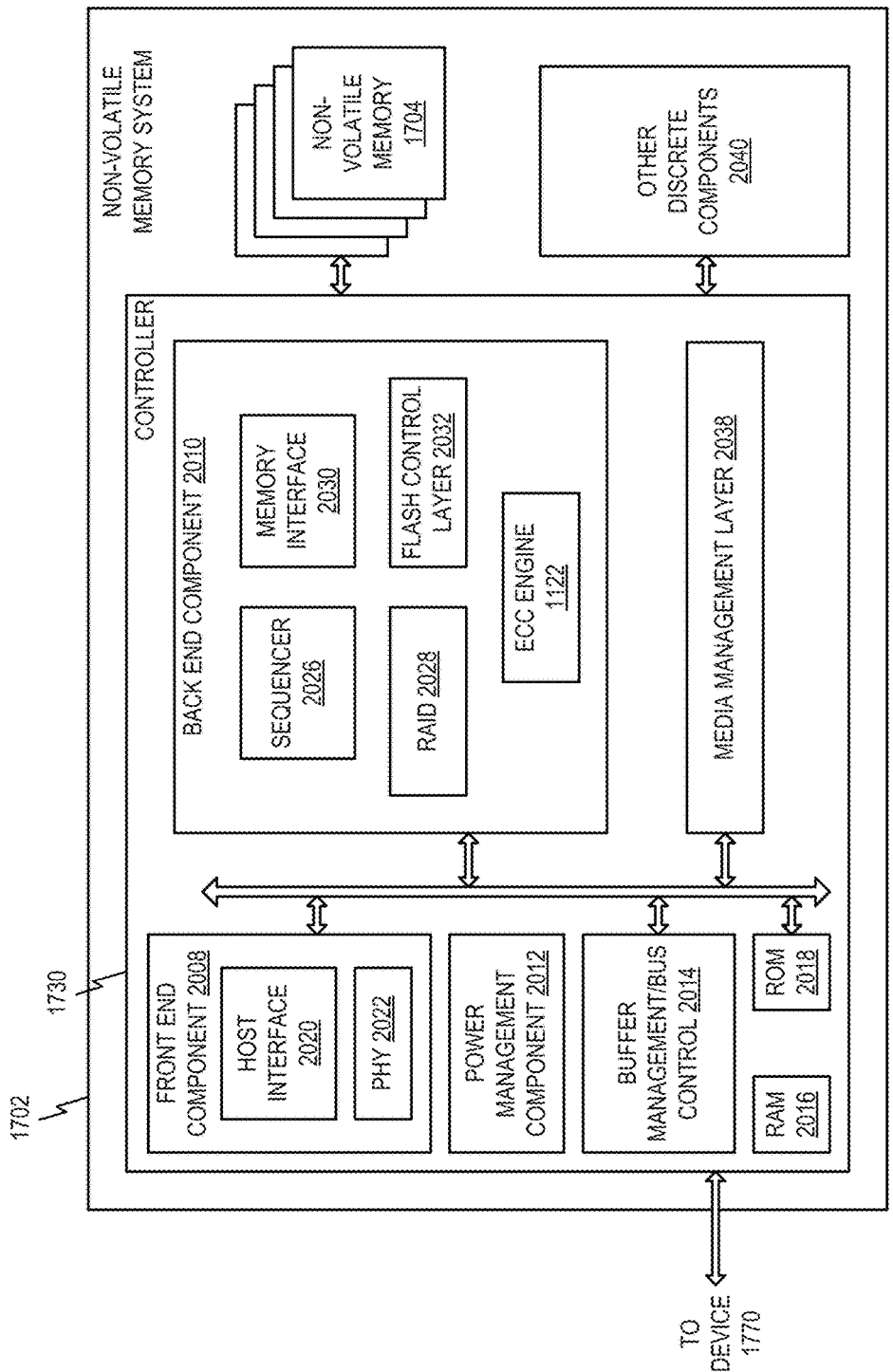
FIG. 20 is a block diagram of a memory system and depicts components of a particular illustrative embodiment of a controller of the non-volatile memory system of FIG. 17.

FIG. 20 is a block diagram illustrating exemplary components of the controller 1730 of the non-volatile memory system 1702 in more detail. The controller 1730 may include the ECC engine 1122. The controller 1730 also includes a front end component 2008 that interfaces with a host device, a back end component 2010 that interfaces with the one or more non-volatile memory dies 1704, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 1730, a buffer manager/bus controller 2014 manages buffers in random access memory (RAM) 2016 and controls the internal bus arbitration of the controller 1730. A read only memory (ROM) 2018 stores system boot code. Although illustrated in FIG. 20 as located within the controller 1730, in other embodiments one or both of the RAM 2016 and the ROM 2018 may be located externally to the controller 1730. In yet other embodiments, portions of RAM and ROM may be located both within the controller 1730 and outside the controller 1730.

Front end component 2008 includes a host interface 2020 and a physical layer interface (PHY) 2022 that provide the electrical interface with the host device or next level storage controller. The choice of the type of host interface 2020 can depend on the type of memory being used. Examples of host interfaces 2020 include, but are not limited to, SATA, SATA Express, SAS, Fibre Channel, USB, PCIe, and NVMe. The host interface 2020 typically facilitates transfer for data, control signals, and timing signals.

Back end component 2010 includes the ECC engine 1122. The ECC engine 1122 may encode the data received from the host device and may decode and error correct the data read from the non-volatile memory. A command sequencer 2026 generates command sequences, such as program and erase command sequences, to be transmitted to the one or more non-volatile memory dies 1704. A RAID (Redundant Array of Independent Drives) component 2028 manages generation of RAID parity and recovery of failed data. The RAID parity may be used as an additional level of integrity protection for the data being written into the one or more non-volatile memory dies 1704. In some cases, the RAID component 2028 may be a part of the ECC engine 1122. A memory interface 2030 provides the command sequences to non-volatile memory die 1704 and receives status information from the one or more non-volatile memory dies 1704. For example, the memory interface 2030 may be a double data rate (DDR) interface, such as a Toggle Mode 200, 400, or 800 interface. A flash control layer 2032 controls the overall operation of back end component 2010.

Additional components of the non-volatile memory system 1702 illustrated in FIG. 20 include a power management component 2012 and a media management layer 2038, which performs wear leveling of memory cells of the one or more non-volatile memory dies 1704. Non-volatile memory system 1702 also includes other discrete components 2040, such as external electrical interfaces, external RAM, resistors, capacitors, or other components that may interface with the controller 1730. In alternative embodiments, one or more of the physical layer interface 2022, RAID component 2028, media management layer 2038 and buffer management/bus controller 2014 are optional components that are omitted from the controller 1730.

Figure 21:
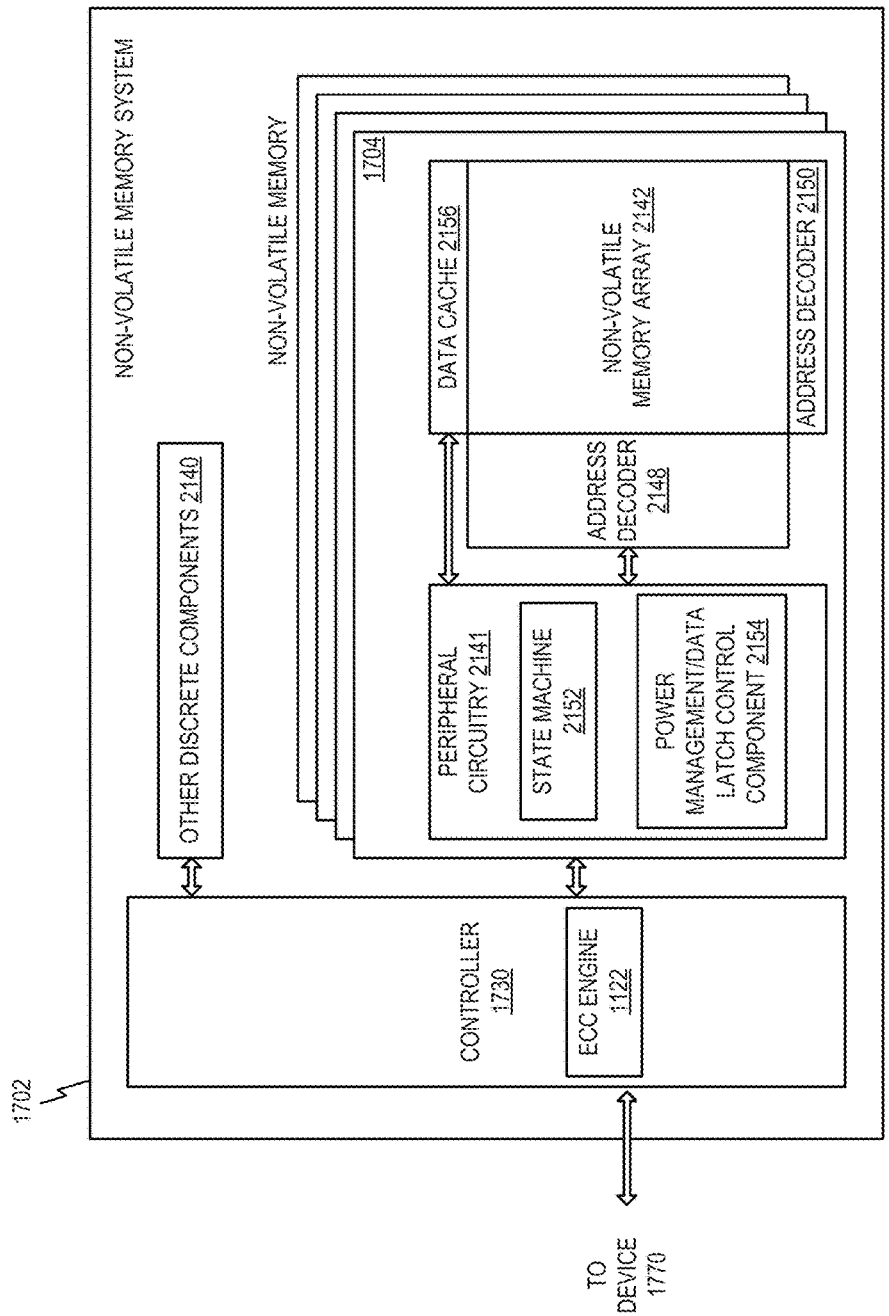
FIG. 21 is a block diagram of a memory system and depicts components of a particular illustrative embodiment of a non-volatile memory die of the non-volatile memory system of FIG. 17.

FIG. 21 is a block diagram illustrating exemplary components of the one or more non-volatile memory dies 1704 of the non-volatile memory system 1702 in more detail. The one or more non-volatile memory dies 1704 include peripheral circuitry 2141 and a non-volatile memory array 2142. The non-volatile memory array 2142 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 2141 includes a state machine 2152 that provides status information to the controller 1730. The peripheral circuitry 2141 may also include a power management or data latch control component 2154. The one or more non-volatile memory dies 1704 further include discrete components 2140, an address decoder 2148, an address decoder 2150, and a data cache 2156 that caches data. FIG. 21 also illustrates that the controller 1730 may include the ECC engine 1122.

Although certain aspects have been described separately for convenience, it should be appreciated that such aspects may be combined without departing from the scope of the disclosure. For example, although certain components and features of the data storage device 102 have been described separately than components and features of the data storage device 1102, it should be appreciated that a data storage device may include such components and features of both the data storage device 102 and the data storage device 1102.

Further, although various components depicted herein are illustrated as block components and described in general terms, such components may include one or more microprocessors, state machines, or other circuits configured to enable the decoder 126 of FIG. 1 to perform initial decode processing at the bit-flipping stage 140 prior to performing belief-propagation decode processing at the second stage 142. For example, the decoder 126 may represent physical components, such as hardware controllers, state machines, logic circuits, or other structures, to enable a decoder (e.g., the decoder 126 of FIG. 1 or the decoder 1126 of FIG. 11) to perform initial decode processing at a bit-flipping stage (e.g., the bit-flipping stage 140 or the bit-flipping circuit 1140) prior to performing belief-propagation decode processing at a second stage (e.g., the second stage 142 or the second stage 1142). The decoder 126 may also represent physical components to provide results of the bit-flipping stage 140 to initialize decoding at the second stage 142, and the decoder 1126 may also represent physical components to provide results of the bit-flipping circuit 1140 to initialize decoding at the second stage 1142.

The decoder 126 may be implemented using a microprocessor or microcontroller programmed to receive data, to provide the data to the bit-flipping stage 140 to perform initial decode processing at the bit-flipping stage 140 prior to attempting to decode the data at the second stage 142. The microprocessor or microcontroller is further programmed to, after processing at the bit-flipping stage 140, provide results of the bit-flipping stage 140 to an input of the second stage 142 to initialize decoding at the second stage 142.

The decoder 1126 may be implemented using a microprocessor or microcontroller programmed to receive data, to provide the data to the bit-flipping circuit 1140 to perform initial decode processing at the bit-flipping circuit 1140 prior to attempting to decode the data at the second stage 1142. The microprocessor or microcontroller is further programmed to, after processing at the bit-flipping circuit 1140, provide results of the bit-flipping circuit 1140 to an input of the second stage 1142 to initialize decoding at the second stage 1142.

In a particular embodiment, the decoder 126 includes a processor executing instructions that are stored at the memory 104. Alternatively, or in addition, instructions that are executed by the processor may be stored at a separate memory location that is not part of the memory 104, such as at a read-only memory (ROM). The decoder 1126 may include a processor configured to execute instructions that are stored at the memory 1104, instructions that are stored at a memory location that is not part of the memory 1104 (e.g., at a ROM), or both.

In a particular embodiment, one or both of the data storage devices 102, 1102 may be implemented in a portable device configured to be selectively coupled to one or more external devices. However, in other embodiments, one or both of the data storage devices 102, 1102 may be attached to or embedded within one or more host devices, such as within a housing of a host communication device. For example, one or both of the data storage devices 102, 1102 may be within a packaged apparatus such as a wireless telephone, a tablet computer, a laptop computer, a personal digital assistant (PDA), a gaming device or console, a portable navigation device, or other device that uses internal non-volatile memory. In a particular embodiment, one or both of the data storage devices 102, 1102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
a memory die including a group of storage elements and one or more unallocated redundant columns, wherein a number of the one or more unallocated redundant columns is based on a number of one or more bad columns of the memory die; and
a controller coupled to the memory die, the controller configured to receive, from the memory die, data and redundancy information associated with the data, the data including a first bit and the redundancy information including a second bit, the redundancy information sensed from the one or more unallocated redundant columns and having a size that is based on the number of one or more bad columns,
wherein the controller is further configured to determine a value of the first bit based on one or more parity check conditions associated with the second bit.

2. The apparatus of claim 1, further comprising a second memory die including a second set of one or more bad columns, wherein a number of the second set of one or more bad columns is different than the number of the one or more unallocated redundant columns of the memory die.

3. The apparatus of claim 2, wherein the second memory die further includes a second set of one or more unallocated redundant columns configured to store second redundancy information having a different data size than the redundancy information.

4. The apparatus of claim 1, wherein the controller includes a control circuit configured to select a subset of bits of the data during an encoding process, the subset of bits including the first bit.

5. The apparatus of claim 4, wherein the controller further includes an exclusive-or (XOR) circuit configured to perform an XOR operation based on the subset of bits to generate the second bit.

6. The apparatus of claim 1, wherein the controller includes a bit-flipping circuit configured to modify the value of the first bit from a first logic value to a second logic value.

7. The apparatus of claim 6, wherein the controller further includes a decoder coupled to the bit-flipping circuit.

8. The apparatus of claim 7, wherein the decoder is configured to receive the modified value from the bit-flipping circuit and to initiate a decoding process to decode the data using the modified value.

9. The apparatus of claim 1, further comprising a circuit included in the memory die and configured to route the second bit to a first storage element of the one or more unallocated redundant columns instead of to a second storage element of the one or more bad columns.

10. The apparatus of claim 9, further comprising a latch of the memory die, wherein the circuit includes one or more of a fuse or an anti-fuse that is coupled to the latch and to the first storage element.

11. The apparatus of claim 1, wherein the controller is further configured to determine the value prior to attempting to decode the data.

12. A method of operation of a data storage device that includes a memory and a controller, the method comprising:
receiving a representation of a codeword from the memory, the representation of the codeword including a first bit;
receiving parity information from the memory, the parity information associated with the codeword and sensed from one or more unallocated redundant columns of the memory, the parity information including a second bit; and
determining a value of the first bit based on one or more parity check conditions associated with the second bit.

13. The method of claim 12, wherein the memory stores the second bit using a first storage element of the one or more unallocated redundant columns instead of using a second storage element of a bad column of the memory.

14. The method of claim 12, wherein determining the value of the first bit includes changing the first bit from a first logic value to a second logic value.

15. The method of claim 14, further comprising:
generating modified data that includes the changed first bit; and
providing the modified data from a bit-flipping circuit to a decoder of the controller to initiate a decoding process.

16. The method of claim 12, wherein the second bit is generated based on an operation associated with a subset of bits of the codeword that includes the first bit.

17. The method of claim 16, wherein the second bit is based on an exclusive-or (XOR) operation of the subset of bits.

18. The method of claim 17, wherein determining the value of the first bit includes modifying the value of the first bit in response to determining that the modified value satisfies the XOR operation.

19. The method of claim 12, wherein a number of bits of the parity information corresponds to a number of columns of the one or more unallocated redundant columns.

20. The method of claim 12, wherein the codeword is a low-density parity check (LDPC) codeword.

21. An apparatus comprising:
means for generating, after encoding data to generate a codeword, parity information including a parity bit based on a subset of bits of the codeword; and
means for sending the codeword to be stored at a group of storage elements of a memory and for sending the parity bit to be stored at an unallocated redundant column associated with the group of storage elements.

22. The apparatus of claim 21, wherein the parity information includes an integer number of N bits, and wherein the means for generating is configured to determine N based on a number of unallocated redundant columns associated with the group of storage elements.

23. The apparatus of claim 21, wherein the means for generating is configured to perform an exclusive-or (XOR) operation based on the subset of bits.

* * * * *